(12) United States Patent
Oh et al.

(10) Patent No.: US 12,487,530 B2
(45) Date of Patent: Dec. 2, 2025

(54) METHOD AND APPARATUS FOR TREATING SUBSTRATE, AND TEMPERATURE CONTROL METHOD

(71) Applicant: SEMES CO., LTD., Chungcheongnam-do (KR)

(72) Inventors: Myung Hwan Oh, Gyeonggi-do (KR); Sung Yong Lee, Gyeonggi-do (KR); Dong Hyuk Seo, Gyeonggi-do (KR); Young Un Yun, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 769 days.

(21) Appl. No.: 17/831,479

(22) Filed: Jun. 3, 2022

(65) Prior Publication Data
US 2022/0390849 A1 Dec. 8, 2022

(30) Foreign Application Priority Data

Jun. 8, 2021 (KR) .................. 10-2021-0074356

(51) Int. Cl.
*G03F 7/40* (2006.01)
*G03F 7/00* (2006.01)
*G03F 7/38* (2006.01)

(52) U.S. Cl.
CPC .............. *G03F 7/40* (2013.01); *G03F 7/38* (2013.01); *G03F 7/70875* (2013.01)

(58) Field of Classification Search
CPC ... G03F 7/40; G03F 7/38; G03F 7/168; G03F 7/70875; G03F 7/70;
(Continued)

(56) References Cited

U.S. PATENT DOCUMENTS

2002/0072025 A1* 6/2002 Ookura ............. H01L 21/67248
118/724
2006/0222975 A1* 10/2006 Ke ..................... G03F 7/70625
430/311
(Continued)

FOREIGN PATENT DOCUMENTS

JP 2008141086 A * 6/2008
JP 2011-165693 A 8/2011
(Continued)

OTHER PUBLICATIONS

English translation of JP2008141086, published Jun. 19, 2008. (Year: 2008).*
(Continued)

*Primary Examiner* — Christina A Riddle
(74) *Attorney, Agent, or Firm* — Carter, DeLuca & Farrell LLP

(57) ABSTRACT

The present invention provides a method of treating a substrate, the method including: performing a first heating process of heat-treating the substrate formed with a film, and a second heating process of heat-treating the substrate after the first heating process is performed; a collection operation of collecting temperature data of a first heating plate which heats the substrate in the first heating process; and a first control operation of adjusting a temperature of a second heating plate which heats the substrate in the second heating process based on the temperature data.

13 Claims, 14 Drawing Sheets

(58) Field of Classification Search
CPC .......................... G03F 7/70483–70541; G03F 7/70605–706851; G03F 7/70691; G03F 7/707; G03F 7/70716; G03F 7/70733; G03F 7/7075; G03F 7/708; G03F 7/70808; G03F 7/7085; G03F 7/70858; G03F 7/70866; G03F 7/70975; G03F 7/70991; G05D 23/1917; H01L 21/67051; H01L 21/67103; H01L 21/67109; H01L 21/6715; H01L 21/67178; H01L 21/67248; H01L 21/67126; H01L 21/0273; H01L 21/67225
USPC .......... 355/18, 30, 52–55, 67–77; 430/5, 22, 430/311, 322, 394
See application file for complete search history.

(56) References Cited

U.S. PATENT DOCUMENTS

2007/0272680 A1* 11/2007 Tadokoro ............. H05B 1/0233
219/494
2008/0156785 A1* 7/2008 Ookura ............. H01L 21/67248
392/340
2008/0255683 A1* 10/2008 Takahashi .......... G05D 23/1935
219/494

FOREIGN PATENT DOCUMENTS

| | | |
|---|---|---|
| KR | 10-2003-0093413 A | 12/2003 |
| KR | 10-2008-0092861 A | 10/2008 |
| KR | 10-2021-0009891 A | 1/2021 |
| KR | 10-2021-0054642 A | 5/2021 |
| WO | 2015/045997 A1 | 4/2015 |

OTHER PUBLICATIONS

English translation of WO2015/045997, published Apr. 2, 2015. (Year: 2015).*

Written Decision on Registration issued by the Korean Intellectual Property Office on Jun. 12, 2023 in corresponding KR Patent Application No. 10-2021-0074356, with English translation.

Notice of Reasons for Refusal issued by the Japanese Patent Office on Jun. 27, 2023 in corresponding JP Patent Application No. 2022-085991, with English translation.

* cited by examiner

METHOD AND APPARATUS FOR TREATING SUBSTRATE, AND TEMPERATURE CONTROL METHOD

CROSS-REFERENCE TO RELATED APPLICATIONS

This application claims priority to and the benefit of Korean Patent Application No. 10-2021-0074356 filed in the Korean Intellectual Property Office on Jun. 8, 2021, the entire contents of which are incorporated herein by reference.

TECHNICAL FIELD

The present invention relates to a method and an apparatus for treating a substrate, and more particularly, to a method and an apparatus for treating a substrate, which heat a substrate by using a heating plate, and a temperature control method of controlling a temperature of the heating plate.

BACKGROUND ART

In order to manufacture a semiconductor device or a flat display panel, various processes, such as a photolithography process, an etching process, an ashing process, a thin film deposition process, a cleaning process, are performed. Among the processes, the photolithography process includes an applying process of forming an applying film on a substrate, such as a wafer, an exposure process of irradiating the applying film formed on the substrate with light by using a mask, and a developing process of supplying a developer to the applying film on which the exposure process has been performed to obtain a desired pattern on the substrate.

In addition, in general, in order to stabilize the applying film and the pattern formed on the substrate, a heat treatment process is performed between the applying process and the exposure process, between the exposure process and the developing process, and after the developing process. In the heat treatment process, a substrate is placed on a heating plate disposed in a heat treating chamber, and the heating plate heats the substrate.

FIG. 1 is a block diagram schematically illustrating a temperature control operation of a heating plate in a general heat treatment process, and FIG. 2 is a graph illustrating a set temperature of the heating plate input as reference data of FIG. 1. Referring to FIGS. 1 and 2, in general, in order to uniformly treat a substrate, the heating plate of a heat treating chamber aims to be constantly maintained at a set temperature RT. Accordingly, a controller C for controlling the temperature of the heating plate receives the set temperature RT as the reference data Ref. In addition, the controller C controls the feedback so that the temperature of the heating plate can be maintained at the set temperature RT input as the reference data Ref.

FIG. 3 is a graph illustrating an actual temperature change of the heating plate of FIG. 1. t1 of FIG. 3 is a time point at which the substrate is introduced into the heat treating chamber or a time point at which the substrate is placed on the heating plate.

The temperature of the substrate is lower than that of the heating plate. Accordingly, when a low-temperature substrate is loaded into the heat treating chamber, the temperature of the heating plate drops rapidly. In this case, a thermal shock may be applied to the heating plate.

In addition, when the temperature of the heating plate drops, the controller C returns the temperature of the heating plate to the set temperature RT through feedback control. For example, the controller C receives a temperature measurement value of the heating plate measured by a temperature sensor, and adjusts the output of a heater that heats the heating plate to return the temperature of the heating plate to the set temperature RT. In this case, it takes time from t1 to t2, that is, as much as a, to stabilize the temperature of the heating plate to the set temperature RT. Accordingly, the time required for performing the heat treatment process increases. In addition, the temperature change width b also increases. When the temperature change width increases, the pattern formed on the substrate and the interval between the patterns are not constant, and variations may occur for each region of the substrate. That is, the temperature change of the heating plate may act more fatally in the heat treatment process performed after the exposure process.

SUMMARY OF THE INVENTION

The present invention has been made in an effort to provide a method and an apparatus for treating a substrate, which are capable of efficiently treating a substrate, and a temperature control method of a heating plate.

The present invention has also been made in an effort to provide a method and an apparatus for treating a substrate, which are capable of minimizing a temperature change of a heating plate that heats a substrate, and a temperature control method of the heating plate.

The present invention has also been made in an effort to provide a method and an apparatus for treating a substrate, which are capable of shortening time consumed for performing a heating process, and a temperature control method of the heating plate.

The present invention has also been made in an effort to provide a method and an apparatus for treating a substrate, which are capable of rapidly stabilizing a temperature change of a heating plate, and a temperature control method of the heating plate.

The problem to be solved by the present invention is not limited to the above-mentioned problems, and the problems not mentioned will be clearly understood by those skilled in the art from the present specification and the accompanying drawings.

An exemplary embodiment of the present invention provides a method of treating a substrate, the method including: performing a first heating process of heat-treating the substrate formed with a film, and a second heating process of heat-treating the substrate after the first heating process is performed; a collection operation of collecting temperature data of a first heating plate which heats the substrate in the first heating process; and a first control operation of adjusting a temperature of a second heating plate which heats the substrate in the second heating process based on the temperature data.

According to the exemplary embodiment, the method may further include a generating operation of generating a target profile for controlling a temperature of the second heating plate from the temperature data, in which the first control operation may include adjusting the temperature of the second heating plate based on the target profile.

According to the exemplary embodiment, the method may further include a second control operation of measuring the temperature of the second heating plate in the second heating process and feedback-controlling the temperature of the second heating plate based on the measured temperature.

According to the exemplary embodiment, the method may further include an exposure process of irradiating the film with light, in which the second heating process may be performed after the exposure process.

According to the exemplary embodiment, the method may further include a developing process of supplying a developer to the film irradiated with the light, in which the second heating process may be performed before the developing process.

According to the exemplary embodiment, the second heating process may be performed multiple times, and a developing process of supplying a developer to the film irradiated with the light may be further included, any one the second heating processes may be performed before the developing process, and another one of the second heating processes may be performed after the developing process.

According to the exemplary embodiment, the first heating process may be performed before the exposure process.

According to the exemplary embodiment, the first heating process may be performed multiple times, the collection operation may include collecting two or more temperature data from the first heating processes, and the generating operation may include generating the target profile from the temperature data.

Further, another exemplary embodiment of the present invention provides a method of controlling a temperature of a temperature adjusting plate that adjusts a temperature of a substrate, the method including: performing a temperature adjusting process that adjusts the temperature of the substrate formed with a film multiple times; a collection operation of collecting temperature data of a first temperature adjusting plate used in a first temperature adjusting process performed before an exposure process among the temperature adjusting processes; a generating operation of predicting a temperature change of a second temperature adjusting plate used in a second temperature adjusting process performed after the exposure process among the temperature adjusting processes based on the temperature data and generating a prediction profile; and a first control operation of controlling a temperature of the second temperature adjusting plate based on the prediction profile.

According to the exemplary embodiment, the generating operation may include generating a target profile symmetric to the prediction profile based on a set temperature, and in the first control operation, a control value for controlling the temperature of the second temperature adjusting plate may be determined based on the target profile.

According to the exemplary embodiment, the temperature data may include information about a temperature change of the first temperature adjusting plate while the first temperature adjusting process is performed, the prediction profile may be generated by a transform function which receives the temperature data and outputs the prediction profile, and the transform function may be generated based on pre-obtained reference data including the information about the temperature change of the first temperature adjusting plate according to a set treatment condition when the substrate is heated by using the first temperature adjusting plate, and information about a temperature change of the second temperature adjusting plate according to a set treatment condition when the substrate is heated by using the second temperature adjusting plate.

According to the exemplary embodiment, the method may further include a second control operation of measuring a temperature of the second temperature adjusting plate in the second temperature adjusting process, and feedback-controlling the temperature of the second temperature adjusting plate to be the set temperature based on the measured temperature, in which the control value for controlling the temperature of the second temperature adjusting plate in the second control operation may be determined based on the measured temperature of the second temperature adjusting plate.

According to the exemplary embodiment, time during which the first control operation is performed and time during which the second control operation is performed may at least partially overlap.

According to the exemplary embodiment, the first temperature adjusting process may be performed multiple times, the collection operation may include collecting the temperature data from the first temperature adjusting processes, and the generating operation may include generating the target profile from the temperature data.

Still another exemplary embodiment of the present invention provides an apparatus for treating a substrate, the apparatus including: a liquid treating chamber for liquid-treating the substrate; a heat treating chamber for heat-treating the substrate; a transfer unit for transferring the substrate between the liquid treating chamber, the heat treating chamber, and an external exposing device; and a controller, in which the heat treating chamber includes: a first heat treating chamber which heat-treats the substrate before an exposure process by the exposing device is performed; and a second heat treating chamber which heat-treats the substrate on which the exposure process has been performed, and the first heat treating chamber includes: a first heating plate which heats the substrate; a first temperature sensor which measures a temperature of the first heating plate; and a first heater which controls the temperature of the first heating plate, and the second heat treating chamber includes: a second heating plate which heats the substrate; a second temperature sensor which measures a temperature of the second heating plate; and a second heater which controls the temperature of the second heating plate, and the controller receives temperature data of the first heating plate measured by the first temperature sensor, and controls the second heater so that the second heating plate reaches a set temperature based on the temperature data.

According to the exemplary embodiment, the controller may generate a prediction profile by predicting a temperature change of the second heating plate from the temperature data and generating a target profile symmetric to the prediction profile based on the set temperature, and the second heater may be controlled based on the target profile.

According to the exemplary embodiment, the controller may receive a temperature value of the second heating plate measured by the second temperature sensor, and feedback-control the second heater so that the received temperature value reaches the set temperature.

According to the exemplary embodiment, the first heater may be provided in plural so as to independently heat a first region of the substrate and a second region that is different from the first region when viewed from the top, and the second heater may be provided in plural so as to independently heat the first region of the substrate and the second region that is different from the first region when viewed from the top.

According to the exemplary embodiment, the first temperature sensor may transmit each of first temperature data of the first heating plate corresponding to the first region and second temperature data of the first heating plate corresponding to the second region to the controller.

According to the exemplary embodiment, the controller may generate a first target profile from the first temperature data, generate a second target profile from the second temperature data, control the second heater corresponding to the first region of the second heating plate based on the first target profile, and control the second heater corresponding to the second region of the second heating plate based on the second target profile.

According to the exemplary embodiment of the present invention, it is possible to provide the method and apparatus for treating a substrate, which are capable of efficiently treating a substrate, and the temperature control method of a heating plate.

Further, according to the exemplary embodiment of the present invention, it is possible to minimize a temperature change of a heating plate heating a substrate.

Further, according to the exemplary embodiment of the present invention, it is possible to shorten time consumed for performing a heating process.

Furthermore, according to the exemplary embodiment of the present invention, it is possible to rapidly stabilize a temperature change of a heating plate.

The effect of the present invention is not limited to the foregoing effects, and non-mentioned effects will be clearly understood by those skilled in the art from the present specification and the accompanying drawings.

DETAILED DESCRIPTION

Figure 1:
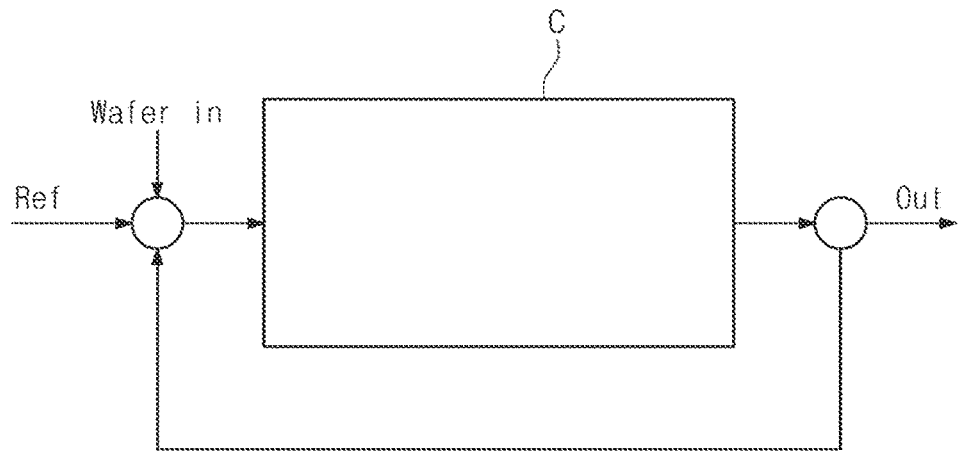
FIG. 1 is a block diagram schematically illustrating a temperature control operation of a heating plate in a general heat treatment process.
Figure 2:
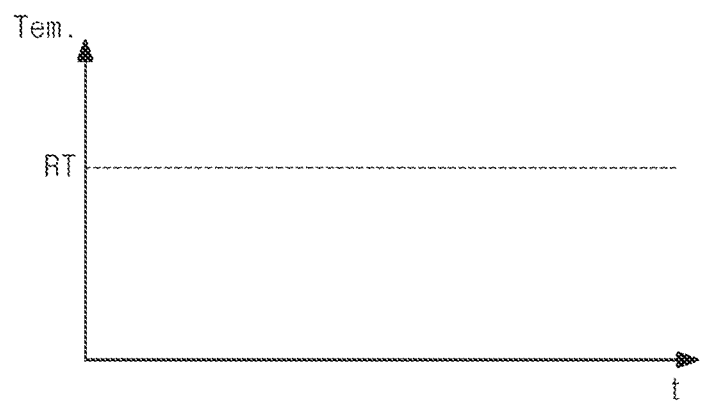
FIG. 2 is a graph illustrating a set temperature of the heating plate input as reference data of FIG. 1.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Hereinafter, exemplary embodiments of the present invention will be described with reference to FIGS. 4 to 19. In addition, all configurations for transferring a substrate W described below may be referred to as a transfer unit.

Figure 4:
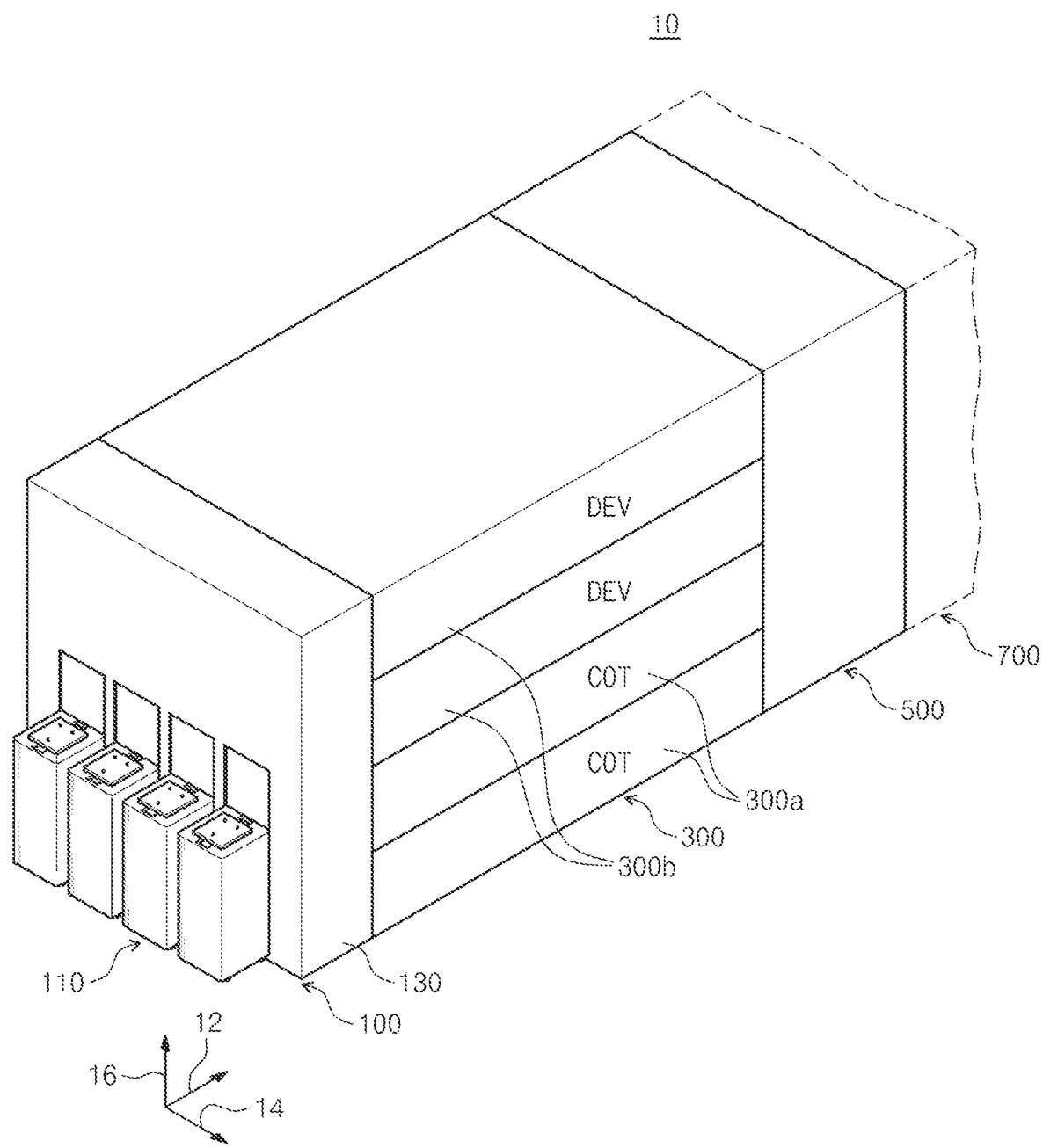
FIG. 4 is a perspective view schematically illustrating a substrate treating apparatus according to an exemplary embodiment of the present invention.
Figure 5:
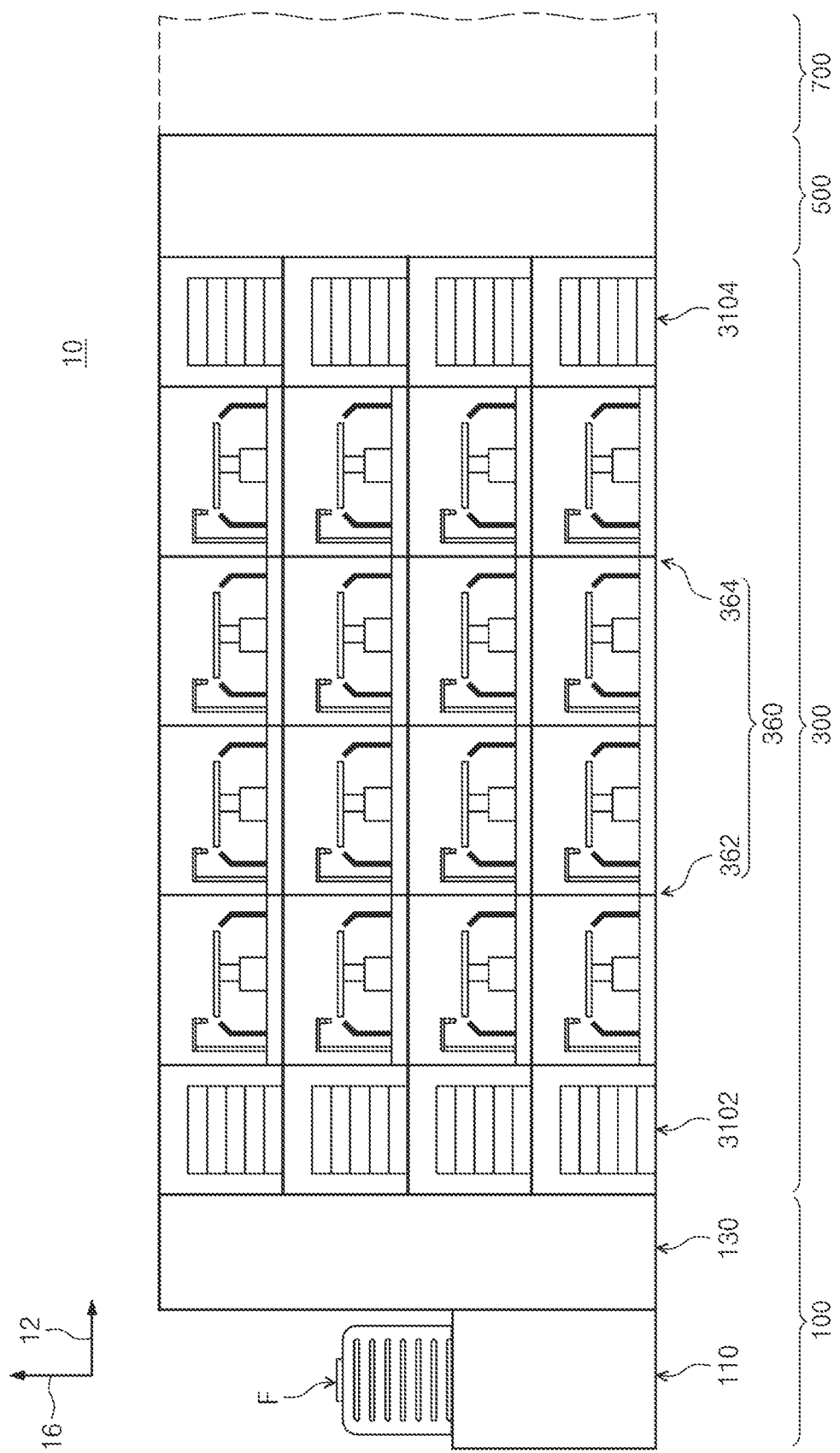
FIG. 5 is a cross-sectional view of the substrate treating apparatus illustrating an applying block or a developing block of FIG. 4.
Figure 6:
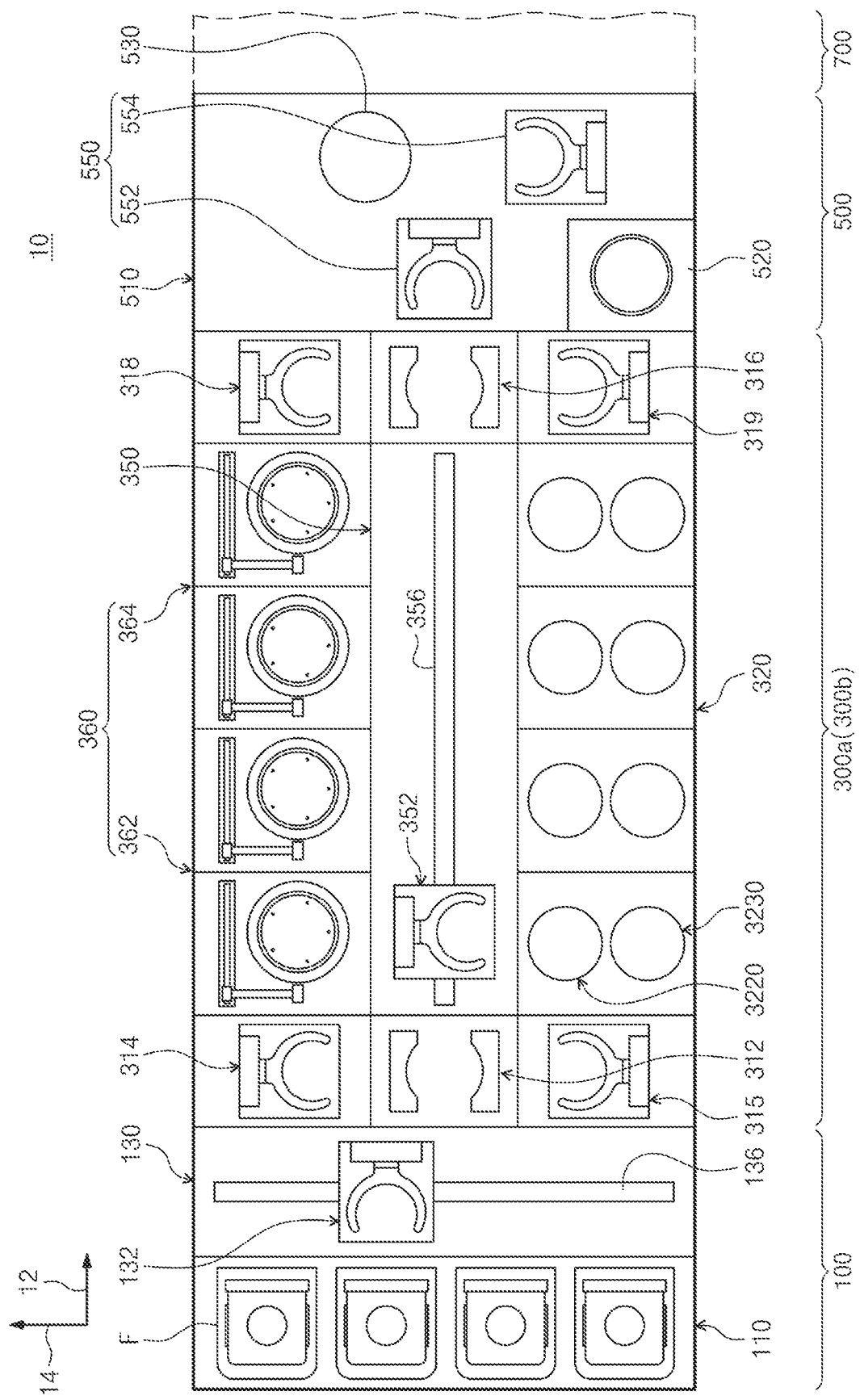
FIG. 6 is a plan view of the substrate treating apparatus of FIG. 4.

FIG. 4 is a perspective view schematically illustrating a substrate treating apparatus according to an exemplary embodiment of the present invention, FIG. 5 is a cross-sectional view of the substrate treating apparatus illustrating an applying block or a developing block of FIG. 4, and FIG. 6 is a plan view of the substrate treating apparatus of FIG. 4.

Referring to FIGS. 4 to 6, a substrate treating apparatus 10 according to the exemplary embodiment of the present invention includes an index module 100, a treating module 300, an interface module 500, and a controller 600. The controller 600 will be described below. According to the exemplary embodiment, the index module 100, the treating module 300, and the interface module 500 are sequentially arranged in series. Hereinafter, the direction in which the index module 100, the treating module 300, and the interface module 500 are arranged is called a first direction 12, and when viewed from the top, a direction perpendicular to the first direction 12 is defined as a second direction 14, and a direction perpendicular to both the first direction 12 and the second direction 14 is defined as a third direction 16.

The index module 100 transfers a substrate W to the treating module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the treating module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The treating module 300 may perform an applying process and a developing process on the substrate W. The treating module 300 may receive the substrate W accommodated in the container F and perform a substrate treating process. The treating module 300 includes an applying block 300a and a developing block 300b. The applying block 300a performs an application process on the substrate W, and the developing block 300b performs a developing process on the substrate W. A plurality of applying blocks 300a is provided, and the applying blocks 300a is provided to be stacked on each other. A plurality of developing blocks 300b is provided, and the developing blocks 300b is provided to be stacked on each other. According to the exemplary embodiment of FIG. 4, two applying blocks 300a are provided, and two developing blocks 30b are provided. The applying blocks 300a may be disposed under the developing blocks 300b. According to an example, the two applying blocks 300a perform the same process, and may be provided in the same structure. Further, the two developing blocks 300b may perform the same process and may be provided in the same structure.

Referring to FIG. 6, each of the applying block 300a and the developing block 300b has a heat treating chamber 320, a transfer chamber 350, a liquid treating chamber 360, and buffer chambers 312 and 316. The heat treating chamber 320, the transfer chamber 350, the liquid treating chamber 360, and the buffer chambers 312 and 316 of the applying block 300a may be called a first heat treating chamber, a first transfer chamber, and a first liquid treating chamber, and a first buffer chamber. The heat treating chamber 320, the transfer chamber 350, the liquid treating chamber 360, and the buffer chambers 312 and 316 of the developing block 300b may be called a second heat treating chamber, a second transfer chamber, and a second liquid treating chamber, and a second buffer chamber.

The heat treating chamber 320 performs a heating process on the substrate W. The liquid treating chamber 360 may supply a liquid onto the substrate W to form a liquid film, or supply a developer for extracting a pattern from the liquid film on which an exposure process has been performed. The liquid film may be a photoresist layer or an Anti-Reflective Applying layer (ARC). The transfer chamber 350 transfers the substrate W between the heat treating chamber 320 and the liquid treating chamber 360 in the applying block 300a or the developing block 300b.

The transfer chamber 350 is provided so that a longitudinal direction thereof is parallel to the first direction 12. The transfer robot 350 is provided to the transfer chamber 352. The transfer robot 352 transfers the substrate between the heat treating chamber 320, the liquid treating chamber 360, and the buffer chambers 312 and 316. According to an example, the transfer robot 352 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 352 may be provided to be movable on the guide rail 356.

A plurality of heat treating chambers 320 is provided. The heat treating chambers 320 are arranged in the first direction 12. The heat treating chambers 320 are located at one side of the transfer chamber 350.

Figure 7:
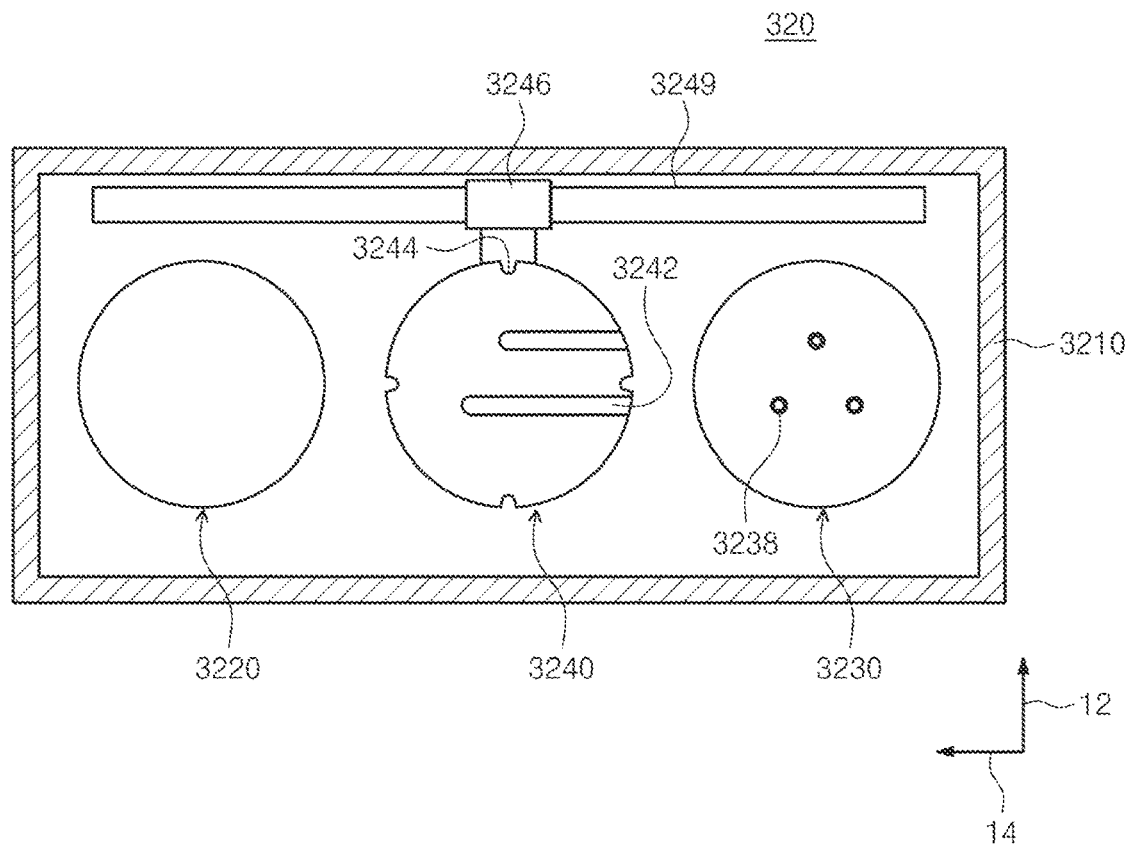
FIG. 7 is a plan view schematically illustrating an example of a heat treating chamber of FIG. 6.
Figure 8:
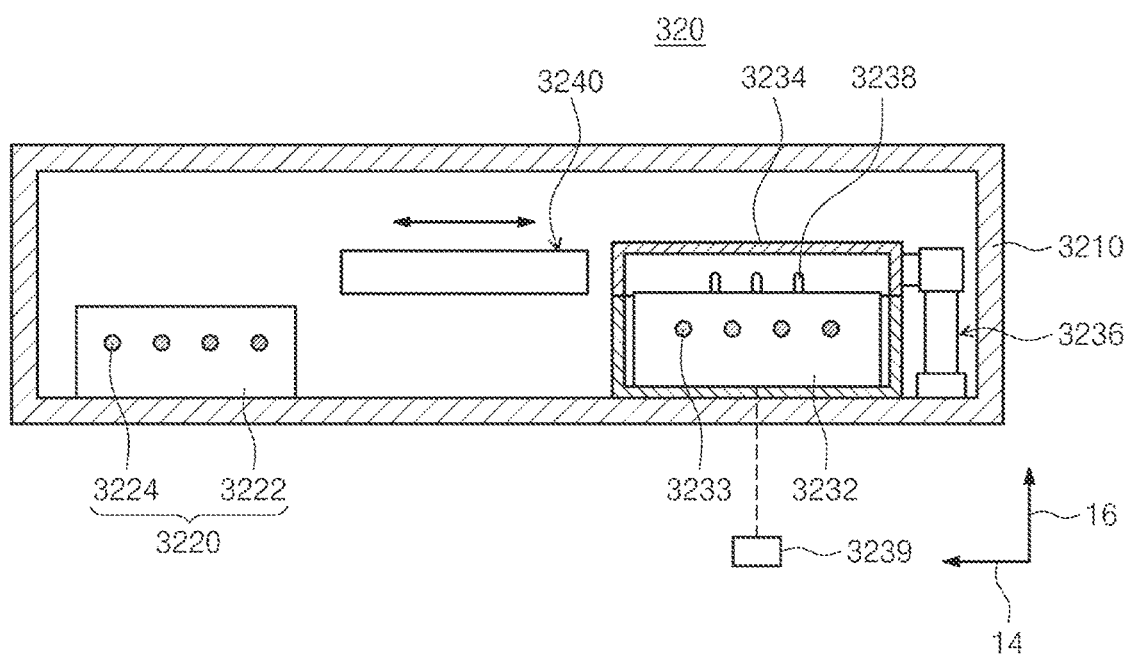
FIG. 8 is a front view of the heat treating chamber of FIG. 7.

FIG. 7 is a plan view schematically illustrating an example of the heat treating chamber of FIG. 6, and FIG. 8 is a front view of the heat treating chamber of FIG. 7.

Referring to FIGS. 7 and 8, the heat treating chamber 320 includes a housing 3210, a cooling unit 3220, a heating unit 3230, and a transfer plate 3240.

The housing 3210 is provided in the shape of a generally rectangular parallelepiped. An inlet (not illustrated) through which the substrate W enters and exits is formed on the sidewall of the housing 3210. The inlet may remain open. Optionally, a door (not illustrated) may be provided to open and close the inlet. The cooling unit 3220, the heating unit 3230, and the conveying plate 3240 are provided in the housing 3210. The cooling unit 3220 and the heating unit 3230 are provided side by side along the second direction 14. According to an example, the cooling unit 3220 may be located closer to the transfer chamber 350 than the heating unit 3230.

The cooling unit 3220 includes a cooling plate 3222. The cooling plate 3222 may have a generally circular shape when viewed from the top. The cooling plate 3222 is provided with a cooling member 3224. According to an example, the cooling member 3224 is formed inside the cooling plate 3222 and may be provided as a flow path through which the cooling fluid flows.

The heating unit 3230 includes a heating plate 3232, a cover 3234, a heater 3233, and a temperature sensor 3239. The heating plate 3232 has a generally circular shape when viewed from the top. The heating plate 3232 has a larger diameter than that of the substrate W. A heater 3233 is installed in the heating plate 3232. The heater 3233 may be provided as a heating resistor to which current is applied. The heating plate 3232 is provided with lift pins 3238 drivable in the vertical direction along the third direction 16. The lift pin 3238 receives the substrate W from the transfer means outside the heating unit 3230 and places the received substrate W on the heating plate 3232 or lifts the substrate W from the heating plate 3232 and takes over the substrate W to a transfer means outside the heating unit 3230. According to an example, three lift pins 3238 may be provided. The cover 3234 has a space with an open lower portion therein. The cover 3234 is positioned above the heating plate 3232 and is moved up and down by the driver 3236. A space formed by the cover 3234 and the heating plate 3232 according to the movement of the cover 3234 is provided as a heating space for heating the substrate W. The temperature sensor 3239 may measure the temperature of the heating plate 3232 in real time and transmit the measured temperature measurement value of the heating plate 3232 to the controller 600 in real time.

In addition, the heating plate 3232, the cover 3234, the heater 3233, and the temperature sensor 3239 of the first heat treating chamber that is the heat treating chamber 320 provided in the applying block 300a may be referred to as a first heating plate, a first cover, a first heater, and a first temperature sensor. In addition, the heating plate 3232, the cover 3234, the heater 3233, and the temperature sensor 3239 of the second heat treating chamber that is the heat treating chamber 320 provided in the developing block 300b may be referred to as a second heating plate, a second cover, a second heater, and a second temperature sensor.

The transfer plate 3240 is provided in a substantially disk shape, and has a diameter corresponding to that of the substrate W. A notch 3244 is formed at the edge of the transfer plate 3240. The notch 3244 may have a shape corresponding to a protrusion 3543 formed on the hand 354 of the transfer robot 352. In addition, the notches 3244 are provided in a number corresponding to the number of protrusions 3543 formed on the hand 354, and are formed at positions corresponding to the protrusions 3543. When the upper and lower positions of the hand 354 and the transfer plate 3240 are changed in a position where the hand 354 and the transfer plate 3240 are vertically aligned, the substrate W is transferred between the hand 354 and the transfer plate 3240. The transfer plate 3240 is mounted on a guide rail 3249, and may be moved between a first region 3212 and a second region 3214 along the guide rail 3249 by a driver 3246. A plurality of slit-shaped guide grooves 3242 is provided in the transfer plate 3240. The guide groove 3242 extends from the end of the transfer plate 3240 to the inside of the transfer plate 3240. The length direction of the guide grooves 3242 is provided along the second direction 14, and the guide grooves 3242 are spaced apart from each other along the first direction 12. The guide groove 3242 prevents the transfer plate 3240 and the lift pins 3238 from interfering with each other when the substrate W is transferred between the transfer plate 3240 and the heating unit 3230.

The substrate W is cooled in the state where the transfer plate 3240 on which the substrate W is placed is in contact with the cooling plate 3222. The transfer plate 3240 is made of a material having high thermal conductivity so that heat transfer between the cooling plate 3222 and the substrate W is well achieved. According to an example, the transfer plate 3240 may be provided with a metal material.

The heating units 3230 provided in some of the heat treating chambers 320 may supply a gas while heating the substrate W to improve the adhesion rate of the photoresist to the substrate W. According to an example, the gas may be a hexamethyldisilane (HMDS) gas.

A plurality of liquid treating chambers 360 is provided. Some of the liquid treating chambers 360 may be provided to be stacked on each other. The liquid treating chambers 360 are disposed at one side of the transfer chamber 350. The liquid processing chambers 360 are arranged side by side along the first direction 12. Some of the liquid processing chambers 360 are provided at positions adjacent to the index module 100. Hereinafter, the liquid treating chambers 360 are referred to as front liquid treating chambers 362. Another some of the liquid treating chambers 360 are provided at positions adjacent to the interface module 500. Hereinafter, the liquid treating chambers 360 are referred to as rear liquid treating chambers 364.

The first liquid treating chamber, which is the liquid treating chamber 360 provided in the applying block 300a may supply an applying liquid, and the second liquid treating chamber, which is the liquid treating chamber 360 provided in the developing block 300b, may supply a developer. Among the liquid treating chambers 360 provided in the applying block 300a, the front liquid treating chamber 362 applies a first liquid on the substrate W, and among the liquid treating chambers 360 provided in the applying block 300a, the rear liquid treating chamber 364 applies a second liquid on the substrate W. The first liquid and the second liquid may be different types of liquid. According to the exemplary embodiment, the first liquid may be an applying liquid for forming an anti-reflective film, and the second liquid may be an applying liquid for forming a photoresist film. The photoresist may be applied onto the substrate W formed with the anti-reflective film. Optionally, the first liquid may be a photoresist, and the second liquid may be an anti-reflective film. In this case, the anti-reflective film may be applied onto the substrate W applied with the photoresist. Optionally, the first liquid and the second liquid are the same type of liquid, and both the first liquid and the second liquid may be the photoresist.

Figure 9:
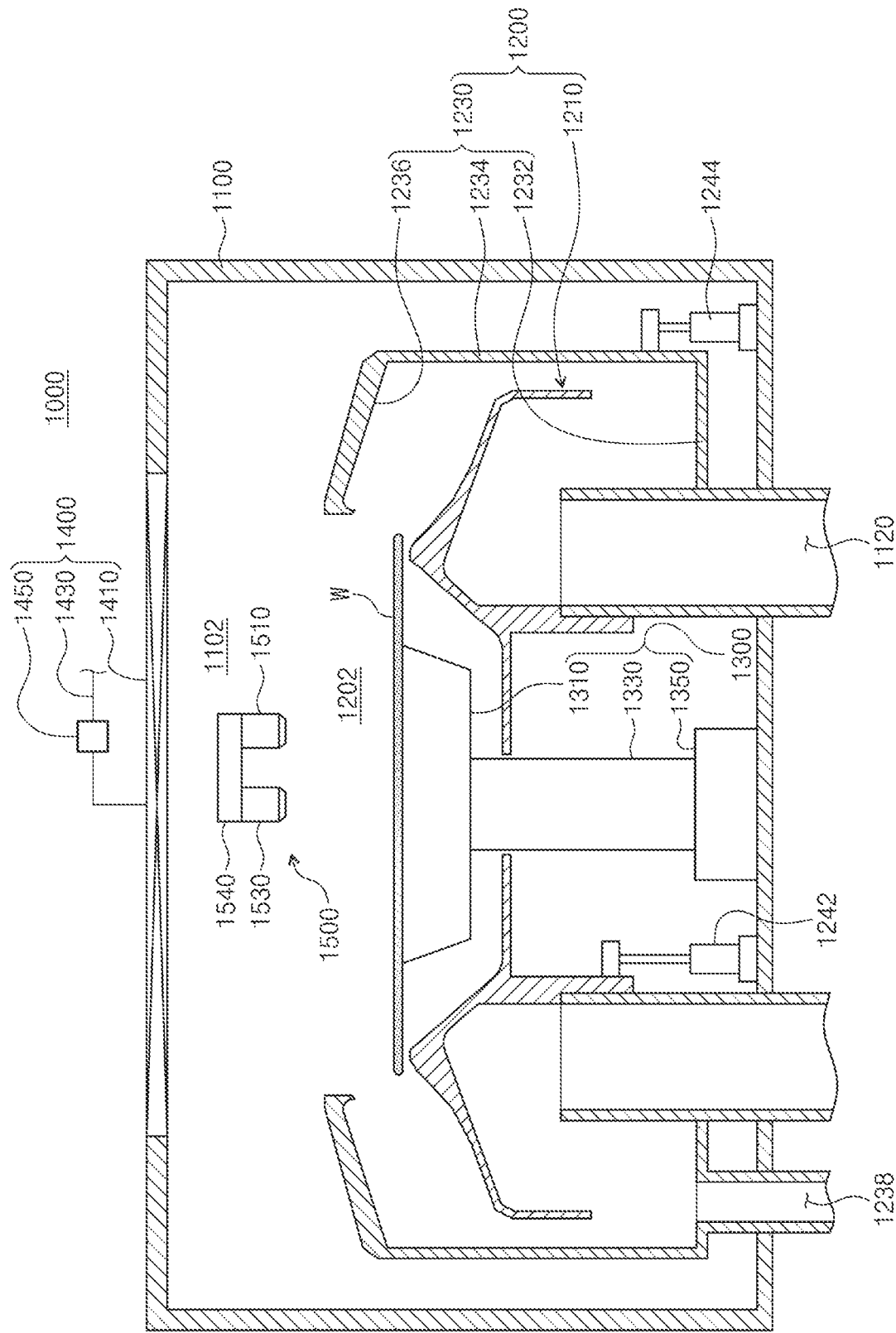
FIG. 9 is a diagram schematically illustrating an example of the substrate treating apparatus provided in a liquid treating chamber of FIG. 7.
Figure 10:
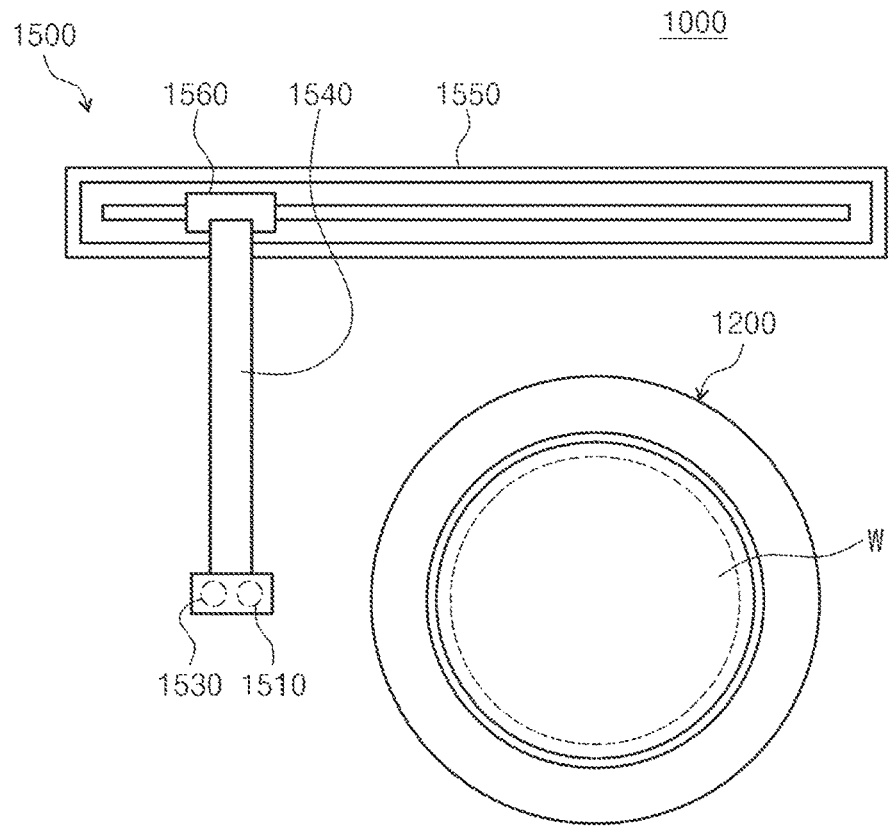
FIG. 10 is a top plan view of the substrate treating apparatus provided in the liquid treating chamber of FIG. 9.

FIG. 9 is a diagram schematically illustrating an example of the substrate treating apparatus provided in the liquid treating chamber of FIG. 7, and FIG. 10 is a top plan view of the substrate treating apparatus provided in the liquid treating chamber of FIG. 9. FIGS. 9 and 10 illustrate the first liquid treating chamber that is the liquid treating chamber 360 provided in the applying block 300a. However, the second liquid treating chamber that is the liquid treating chamber 360 provided in the developing block 300b includes the configurations that are the same as or similar to those of the first liquid treating chamber, so that the repeated description of the second liquid treating chamber will be omitted.

Referring to FIGS. 9 and 10, the substrate treating apparatus 1000 treating the substrate W may be provided in the liquid treating chamber 360. The substrate treating apparatus 1000 performing the liquid treatment on the substrate W may be provided in the liquid treating chamber 360.

The substrate treating apparatus 1000 provided in the liquid treating chamber 360 may include a housing 1100, a treating container 1200, a support unit 1300, an air flow supply unit 1400, a liquid supply unit 1500, and a controller 1900.

The housing 1100 may have an inner space 1102. The housing 1100 may be provided in a quadrangular cylindrical shape having the inner space 1102. An opening (not illustrated) may be formed at one side of the housing 1100. The opening may serve as an inlet through which the substrate W is loaded into the inner space 1102 or the substrate W is unloaded from the inner space 1102. In addition, in order to selectively close the opening, a door (not illustrated) may be installed in an area adjacent to the opening. The door may seal the internal space 1102 by blocking the opening while the treatment process for the substrate W loaded into the internal space 1102 is performed.

The treatment container 1200 may be disposed in the internal space 1102. The treatment container 1200 may have a treatment space 1202. That is, the treatment container 1200 may be a bowl having the treatment space 1202. Accordingly, the inner space 1102 may be provided to surround the treatment space 1202. The treatment container 1200 may have a cup shape with an open top. The treatment space 1202 of the treatment container 1200 may be a space in which a support unit 1300, which is to be described below, supports and rotates the substrate W. The treatment space 1202 may be a space in which each of the liquid supply unit 1500 and a wetting unit 1600 supplies a treatment medium and the substrate W is treated.

The treatment container 1200 may include an inner cup 1210 and an outer cup 1230. The outer cup 1230 is provided to surround the circumference of the support unit 1300, and the inner cup 1210 may be located inside the outer cup 1230. Each of the inner cup 1210 and the outer cup 1230 may have an annular ring shape when viewed from the top. A space between the inner cup 1210 and the outer cup 1230 may function as a recovery path through which the treatment medium introduced into the treatment space 1202 is recovered.

The inner cup 1230 may be provided in a shape surrounding a rotation shaft 1330 of the support unit 1300, which is to be described below, when viewed from the top. For example, the inner cup 1230 may be provided in a circular plate shape surrounding the rotation shaft 1330 when viewed from above. When viewed from the top, the inner cup 1230 may be positioned to overlap an exhaust port 1120 coupled to the housing 1100. The inner cup 1230 may have an inner portion and an outer portion. An upper surface of each of the inner portion and the outer portion may be provided to have different angles from each other based on an virtual horizontal line. For example, when viewed from the top, the inner portion may be positioned to overlap the support plate 1310 of the support unit 1300, which is to be described below. The inner portion may be positioned to face the rotation shaft 1330. The inner portion may have an upper surface inclined upward as it goes away from the rotation shaft 1330, and the outer portion may extend outwardly from the inner portion. The outer portion may have an upper surface inclined downward as it goes away from the rotation shaft 1330. The upper end of the inner portion may coincide with the side end portion of the substrate W in the vertical direction. According to the example, the point where the outer portion and the inner portion meet may be a position lower than the upper end of the inner portion. The point where the inner portion the outer portion meet each other may be provided to be rounded. The outer portion may be combined with the outer cup 1230 to form a recovery path through which a treatment medium, such as a treatment liquid and a wet medium, is recovered.

The outer cup 1230 may be provided in a cup shape surrounding the support unit 1300 and the inner cup 1210. The outer cup 1230 may have a bottom portion 1232, a side portion 1234, and an inclined portion 1236. The bottom portion 1232 may have a circular plate shape having a hollow. A recovery line 1238 may be connected to the bottom portion 1232. The recovery line 1238 may recover the treatment medium supplied on the substrate W. The treatment medium recovered by the recovery line 1238 may be reused by an external recycling system. The side portion 1234 may have an annular ring shape surrounding the support unit 1300. The side portion 1234 may extend in a vertical direction from the side end of the bottom portion 1232. The side portion 1234 may extend upwardly from bottom portion 1232.

The inclined portion 1236 may extend from an upper end of the side portion 1234 in a direction toward the central axis of the outer cup 1230. An inner surface of the inclined portion 1236 may be provided to be inclined upward to approach the support unit 1300. The inclined portion 1236 may be provided to have a ring shape. During the treatment process for the substrate W, the upper end of the inclined portion 1236 may be positioned higher than the substrate W supported by the support unit 1300.

The inner lifting member 1242 and the outer lifting member 1244 may move the inner cup 1210 and the outer cup 1230 up and down, respectively. The inner lifting member 1242 is coupled to the inner cup 1210, and the outer lifting member 1244 is coupled to the outer cup 1230 to move the inner cup 1210 and the outer cup 1230 up and down, respectively.

The support unit 1300 may support and rotate the substrate W. The support unit 1300 may be a chuck that supports and rotates the substrate W. The support unit 1300 may include the support plate 1310, the rotation shaft 1330, and a rotation driver 1350. The support plate 1310 may have a seating surface on which the substrate W is seated. The support plate 1310 may have a circular shape when viewed from the top. The support plate 1310 may have a smaller diameter than the substrate W when viewed from the top. A suction hole (not illustrated) is formed in the support plate 1310 to chuck the substrate W by a vacuum suction method. Optionally, an electrostatic plate (not illustrated) is provided on the support plate 1310 to chuck the substrate W by an electrostatic adsorption method using static electricity. Optionally, the support plate 1310 may be provided with support pins for supporting the substrate W so that the support pins and the substrate W are physically in contact with each other to chuck the substrate W.

The rotation shaft 1330 may be coupled to the support plate 1310. The rotation shaft 1330 may be coupled to a lower surface of the support plate 1310. The rotation shaft 1330 may be provided such that a longitudinal direction thereof is in the vertical direction. The rotation shaft 1330 may be rotated by receiving power from the rotation driver 1350. Accordingly, the rotation shaft 1330 may rotate the support plate 1310. The rotation driver 1350 may vary the rotation speed of the rotation shaft 1330. The rotation driver 1350 may be a motor that provides driving force. However, the present invention is not limited thereto, and the rotation driver 1350 may be variously modified to a known device that provides driving force.

The airflow supply unit 1400 may supply an airflow to the inner space 1102. The airflow supply unit 1400 may supply a descending airflow to the inner space 1102. The airflow supply unit 1400 may supply the temperature and/or humidity-controlled airflow to the inner space 1102. The airflow supply unit 1400 may be installed in the housing 1100. The airflow supply unit 1400 may be installed above the processing vessel 1200 and the support unit 1300. The airflow supply unit 1400 may include a fan 1410, an airflow supply line 1430, and a filter 1450. The airflow supply line 1430 may supply an external airflow whose temperature and/or humidity is controlled to the inner space 1102. A filter 1450 is installed in the airflow supply line 1430 to remove impurities contained in the external airflow flowing through the airflow supply line 1430. In addition, when the fan 1410 is driven, the external airflow supplied by the airflow supply line 1430 may be uniformly transmitted to the internal space 1102.

The liquid supply unit 1500 may supply the treatment liquid to the substrate W supported by the support unit 1300. The treatment liquid PR supplied by the liquid supply unit 1500 to the substrate W may be an applying liquid. For example, the applying liquid may be a photosensitive liquid, such as a photoresist. Also, the liquid supply unit 1500 may supply a pre-wet liquid to the substrate W supported by the support unit 1300. The pre-wet liquid TH supplied by the liquid supply unit 1500 to the substrate W may be a liquid capable of changing the surface properties of the substrate W. For example, the pre-wet liquid TH may be a thinner capable of changing the surface property of the substrate W to have a hydrophobic property.

The liquid supply unit 1500 may include a free wet nozzle 1510, a treatment liquid nozzle 1530, an arm 1540, a guide rail 1550, and a driver 1560.

The pre-wet nozzle 1510 may supply the above-described pre-wet liquid TH to the substrate W. The pre-wet nozzle 1510 may supply the pre-wet liquid TH to the substrate W in a stream manner. The treatment liquid nozzle 1530 may supply the above-described treatment liquid PR to the substrate W. The treatment liquid nozzle 1530 may be an applying liquid nozzle that supplies an applying liquid, such as the above-described photoresist. The treatment liquid nozzle 1530 may supply the treatment liquid PR to the substrate W in a stream manner.

The arm 1540 may support the free wet nozzle 1510 and the treatment liquid nozzle 1530. The free wet nozzle 1510 and the treatment liquid nozzle 1530 may be installed at one end of the arm 1540. Each of the free wet nozzle 1510 and the treatment liquid nozzle 1530 may be installed on the lower surface of one end of the arm 1540. When viewed from the top, the free wet nozzle 1510 and the treatment liquid nozzle 1530 may be arranged in a direction parallel to the longitudinal direction of the guide rail 1550 which is to be described below. The other end of the arm 1540 may be coupled to the driver 1560. The arm 1540 may be moved by driver 1560 which moves arm 1540. Accordingly, the positions of the free wet nozzle 1510 and the treatment liquid nozzle 1530 installed on the arm 1540 may be changed. The movement direction of the arm 1540 may be guided along the guide rail 1550 on which the driver 1560 is installed. The guide rail 1550 may be provided such that a longitudinal direction thereof faces a horizontal direction. For example, the guide rail 1550 may be provided such that its longitudinal direction faces a direction parallel to the first direction 12. Optionally, the arm 1540 may be rotated by being coupled to the rotation shaft whose longitudinal direction faces the third direction 16. The rotation shaft may be rotated by the driver. Accordingly, the positions of the free wet nozzle 1510 and the treatment liquid nozzle 1530 installed on the arm 1540 may be changed.

Referring back to FIGS. 5 and 6, a plurality of buffer chambers 312 and 316 are provided. Some of the buffer chambers 312 and 316 are disposed between the index module 100 and the transfer chamber 350. Hereinafter, the foregoing buffer chambers are referred to as front buffers 312. A plurality of front buffers 312 are provided, and are positioned to be stacked on each other in the vertical direction. Another part of the buffer chambers 312 and 316 is disposed between the transfer chamber 350 and the interface module 500. Hereinafter, the foregoing buffer chambers are referred to as rear buffers 316. A plurality of rear buffers 316 are provided, and are positioned to be stacked on each other in the vertical direction. Each of the front buffers 312 and the rear buffers 316 temporarily stores a plurality of substrates W. The substrate W stored in the front buffer 312 is loaded or unloaded by the index robot 132 and the transfer robot 352. The substrate W stored in the rear buffer 316 is loaded or unloaded by the transfer robot 352 and the first robot 552.

In addition, a first front buffer robot 314 and a second front buffer robot 315 for transferring the substrate W between the front buffers 312 may be provided on one side and the other side of the front buffer 312. The first front buffer robot 314 and the second front buffer robot 315 may be positioned symmetrically to each other with the front buffer 312 interposed therebetween when viewed from the top. In addition, the first front buffer robot 314 and the second front buffer robot 315 may each have a transfer hand. In addition, the first front buffer robot 314 and the second front buffer robot 315 may be provided at different heights from each other.

In addition, a first rear buffer robot 318 and a second rear buffer robot 319 for transferring the substrate W between the rear buffers 316 may be provided on one side and the other side of the rear buffer 316. The first rear buffer robot 318 and the second rear buffer robot 319 may be positioned symmetrically to each other with the rear buffer 316 interposed therebetween when viewed from the top. In addition, the first rear buffer robot 318 and the second rear buffer robot 319 may each have a transfer hand. In addition, the first rear buffer robot 318 and the second rear buffer robot 319 may be provided at different heights from each other.

The interface module 500 connects the treating module 30 to an external exposing device 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. In the additional process chamber 520, the substrate W that has been completely processed in the applying block 300a may be transferred to the exposing device 700. In the exposing device 700, an exposure process of irradiating light by using a mask may be performed on the substrate W on which the applying film is formed. In addition, a predetermined additional process may be performed before the substrate W is loaded into the exposing device 700. Optionally, the additional process chamber 520 may perform a predetermined additional process before the substrate W, which has been completely processed in the exposing device 700, is loaded into the developing block 300b. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the applying block 300a, the additional process chamber 520, the exposing device 700, and the developing block 300b temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the applying block 300a, the additional process chamber 520, the exposing device 700, and the developing block 300b. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the applying block 300a, the additional process chamber 520, and the interface buffer 530, and the second robot 554 may be provided to transfer the substrate W between the interface buffer 530 and the exposing device 700, and the second robot 554 may be provided to transfer the substrate W between the interface buffer 530 and the developing block 300b.

The first robot 552 and the second robot 554 each include a transfer hand on which the substrate W is placed, and the hand may be provided to be movable forward and backward, rotatable about an axis parallel to the third direction 16, and movable along the third direction 16.

Figure 11:
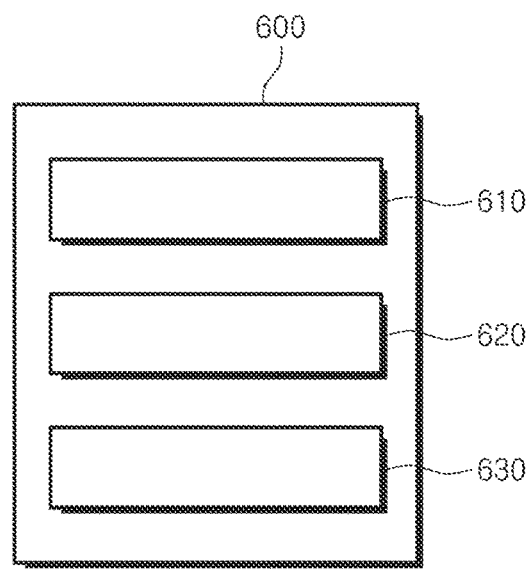
FIG. 11 is a block diagram schematically illustrating a controller of the present invention.

FIG. 11 is a block diagram schematically illustrating a controller of the present invention. The controller 600 may control the substrate treating apparatus 10. The controller 600 may control the configurations of the substrate treating apparatus 10. The controller 600 may control the configurations of the substrate treating apparatus 10 to perform a substrate treating method and a temperature control method which are to be described below. For example, the controller 600 may control the second heater included in a second heat treating chamber so as to perform the substrate treating method and the temperature control method described below. In addition, the controller 600 may receive temperature data for a temperature change of the first heating plate and the second heating plate from the first temperature sensor and the second temperature sensor, respectively, in real time so as to perform the substrate treating method and the temperature control method described below.

The controller 600 may include a first controller 610, a second controller 620, and a profile generator 630. The first controller 610 may be a tracking controller that performs a first control operation S23-1 to be described below. The second controller 620 may be a regulation controller that performs a second control operation S23-2 to be described below. The profile generating unit 630 may perform a generating operation S22 which is to be described below. Further, the controller 600 may include a process controller formed of a microprocessor (computer) that executes the control of the substrate treating apparatus 10, a user interface formed of a keyboard in which an operator performs a command input operation or the like in order to manage the substrate treating apparatus 10, a display for visualizing and displaying an operation situation of the substrate treating apparatus 10, and the like, and a storage unit storing a control program for executing the process executed in the substrate treating apparatus 10 under the control of the process controller or a program, that is, a treatment recipe, for executing the process in each component according to various data and processing conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

Figure 12:
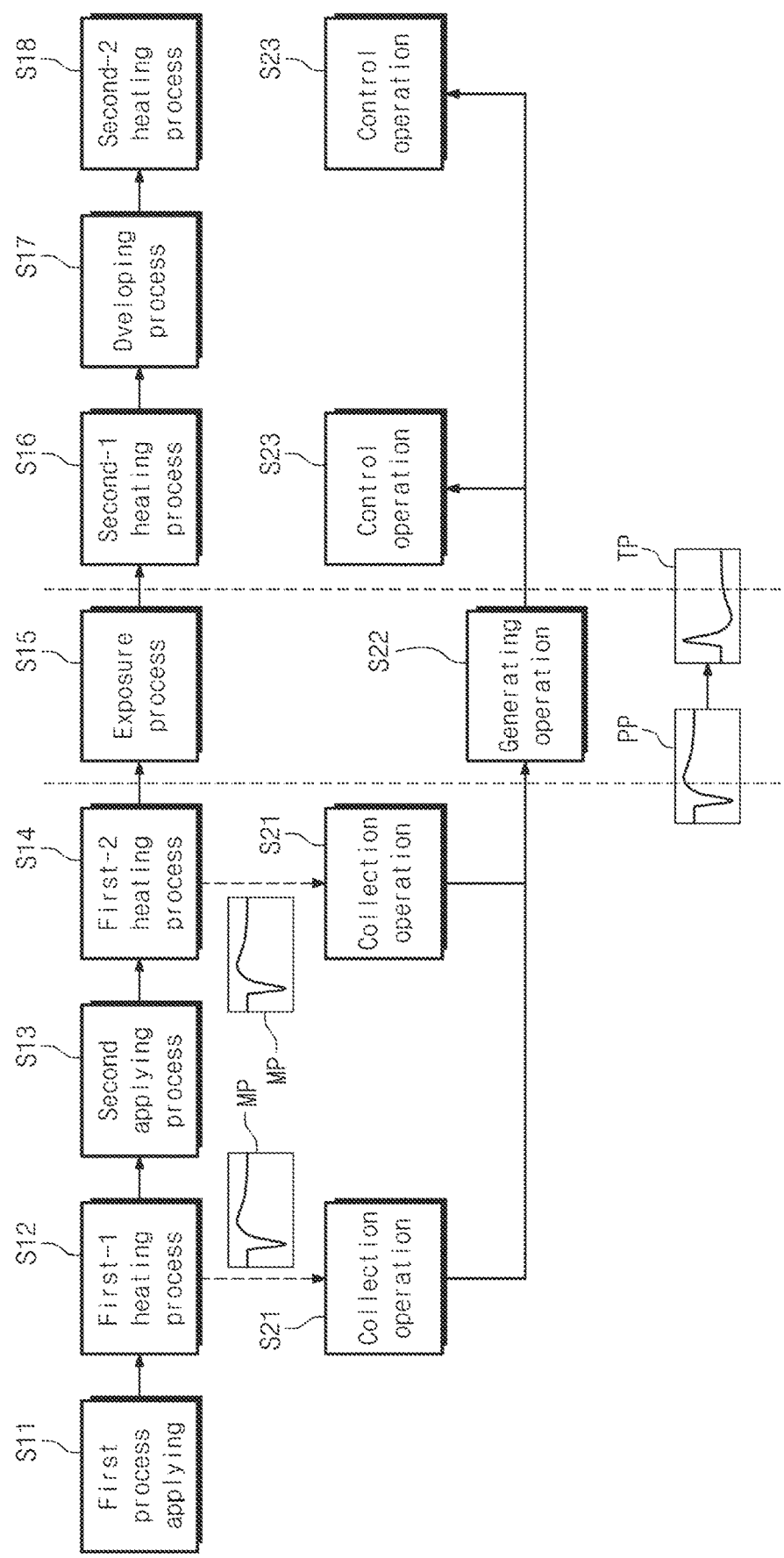
FIG. 12 is a flowchart schematically illustrating a substrate treating method and a temperature control method according to an exemplary embodiment of the present invention.

FIG. 12 is a flowchart schematically illustrating a substrate treating method and a temperature control method according to an exemplary embodiment of the present invention. Referring to FIG. 12, a substrate treating method according to an exemplary embodiment of the present invention may include an application process S11 and S13, an exposure process S15, and a developing process S17. The application processes S11 and S13 may include a first application process S11 and a second application process S13. The first application process S11 may be a process of forming a thin film, such as the above-described ARC, on the substrate W by supplying an applying liquid. The second application process S13 may be a process of supplying an applying liquid to form a thin film, such as the above-described photoresist film, on the substrate W. The exposure process S15 may be a process of irradiating the thin film formed on the substrate W with light by using a mask. The developing process S17 may be a process of forming a pattern on the substrate W by supplying a developer to the thin film on the substrate W on which the exposure process S15 has been performed.

A first-1 heating process S12 may be performed between the first applying process S11 and the second applying process S13. The first-1 heating process S12 may be an ARC bake process of stabilizing the above-described ARC.

A first-2 heating process S14 may be performed between the second applying process S13 and the exposure process S15. The first-2 heating process S14 may be a soft bake process of stabilizing the above-described photoresist film and heating the substrate W to a low temperature. In the first-2 heating process S14, the solvent component remaining on the substrate W may be evaporated.

In addition, the first-1 heating process S12 and the first-2 heating process S14 performed before the exposure process S15 may be referred to as a first heating process.

A second-1 heating process S16 may be performed between the exposure process S15 and the developing process S17. The second-1 heating process S16 may be a Post Exposure Bake (PEB) process. In the second-1 heating process S16, the surface of the photoresist film on the substrate W may be planarized and the standing wave (grain formed at the photoresist film interface due to light interference during exposure processing) may be improved.

After the developing process S17 is performed, a second-2 heating process S18 may be performed. The second-2 heating process S18 may be a hard bake process in which the solvent and developer remaining on the substrate W are removed and the thermal properties of the photoresist film are improved.

In addition, the second-1 heating process S16 and the second-2 heating process S18 performed after the exposure process S15 may be referred to as a second heating process.

The first heating process may be performed in the first heat treating chamber, which is the heat treating chamber 320 provided in the above-described applying block 300a. The second heating process may be performed in the second heat treatment processing chamber, which is the heat treating chamber 320 provided in the above-described developing block 300b.

Hereinafter, a temperature control method of the second heating plate provided in the second heat treating chamber will be described in detail.

Referring back to FIG. 12, the temperature control method of the second heating plate for heating the substrate W according to the exemplary embodiment of the present invention may include a collection operation S21, a generating operation S22, and a control operation S23.

In the collection operation S21, the temperature data MP of the first heating plate for heating the substrate W in the first heating processes S12 and S14 may be collected. For example, in the collection operation S21, the first temperature sensor may measure the temperature of the first heating plate, and the measured temperature data may be transmitted to the controller 600. The temperature data MP may include information about a temperature change of the first heating plate over time. The collection operation S21 may be performed a plurality of times. For example, the collection operation S21 may be performed in each of the first-1 heating process S12 and the first-2 heating process S14. That is, in the collection operation S21, at least two or more temperature data MP may be performed from each of the first heating processes performed a plurality of times.

In the generating operation S22, a target profile TP for allowing the temperature of the second heating plate to reach a set temperature may be generated based on the collected temperature data MP.

Figure 13:
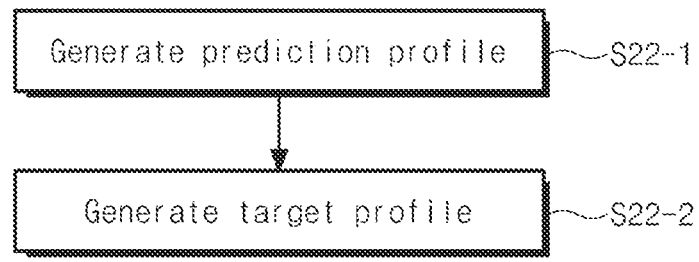
FIG. 13 is a detailed flowchart of a generating operation of FIG. 12.
Figure 14:
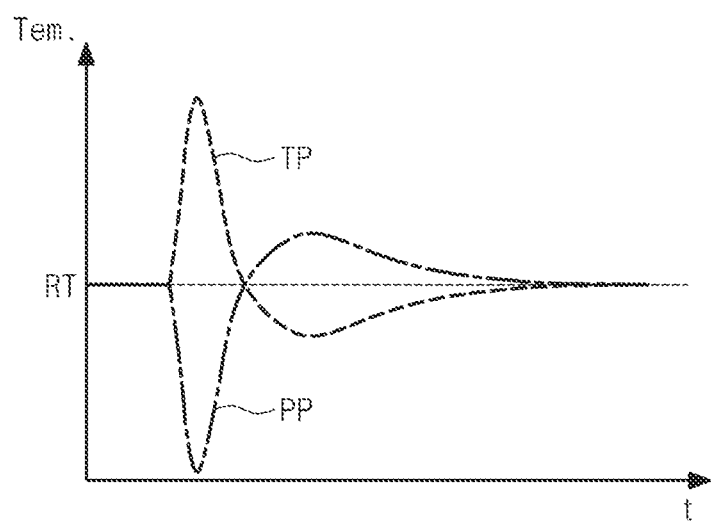
FIG. 14 is a graph illustrating the state of a prediction profile and a target profile generated in the generating operation of FIG. 13.

FIG. 13 is a detailed flowchart of a generating operation of FIG. 12, and FIG. 14 is a graph illustrating the state of a prediction profile and a target profile generated in the generating operation of FIG. 13. Referring to FIGS. 13 and 14, the generating operation S22 may include a prediction profile generating operation S22-1 and a target profile generating operation S22-2.

In the prediction profile generating operation S22-1, a prediction profile PP regarding the temperature change of the second heating plate predicted based on the temperature data MP regarding the temperature change of the first heating plate collected in the collection operation S21 may be generated. For example, the prediction profile PP may be generated by a transformation function using the temperature data MP as an input value and the prediction profile PP as an output value. The transform function may be generated by reference data obtained in advance.

Specifically, the first heating processes S12 and S14 and the second heating processes S16 and S18 may have different treatment conditions for treating the substrate. For example, the temperature at which the substrate W is heated in the first heating processes S12 and S14 and the temperature at which the substrate W is heated in the second heating processes S16 and S18 may be different. In addition, the temperature of the substrate W loaded into the first heating unit during the first heating processes S12 S14 and the temperature of the substrate W loaded into the second heating unit during the second heating processes S16 and S18 may be different from each other. In other words, the temperature change of the first heating plate in the first heating processes S12 and S14 may not be completely the same as the temperature change of the second heating plate in the second heating processes S16 and S18. The transform function may output the prediction profile PP in consideration of the difference in treatment conditions set between the heating processes. In addition, the transform function makes it possible to output the prediction profile PP in consideration of the difference in physical properties between the first heating plate and the second heating plate.

The transform function may be generated through reference data obtained in advance. The reference data may be data obtained in advance. The reference data may include information on the temperature change of the first heating plate according to the set treatment conditions when the substrate is heated by using the first heating plate, and information on the temperature change of the second heating plate according to the set treatment conditions when the substrate is heated by using the second heating plate. When the temperature change of the first heating plate and the temperature change of the second heating plate are collected from the reference data, the to-be-treated target may be the same substrate. For example, the substrate heated by the first heating plate may be transferred to the second heating plate when the reference data is acquired. Reference data includes the set treatment conditions (for example, target heating temperature of the substrate W and heating time) when the substrate W is heated by using the first heating plate and the set treatment conditions (for example, target heating temperature of the substrate W and heating time) when the substrate W is heated by using the second heating plate.

A plurality of reference data may be obtained. A plurality of reference data may be statisticalized. The transform function generated on the basis of the statistical reference data may output the predicted profile PP which is the temperature change of the second heating plate in the second heating processes S16 and S18 by using the temperature data MP obtained in the first heating processes S12 and S14 as an input value.

In the target profile generating operation S22-2, a target profile TP for allowing the second heating plate to reach the set temperature RT may be generated from the predicted profile PP. The target profile TP may have a shape symmetrical to the predicted profile PP based on the set temperature RT.

Also, the generating operation S22 may be performed while the exposure process S15 is performed. That is, since the generation of the target profile TP is performed while the exposure process S15 is performed, it is possible to prevent the above-described second heating process from being delayed.

Referring back to FIG. 12, the target profile TP generated in the generating operation S22 may be used to control the temperature of the second heating plate for heating the substrate W in the second heating process. For example, the target profile TP may be used to control the temperature of the second heating plate heating the substrate W in the second-1 heating process S16 performed after the exposure process S15 and/or the second-2 heating process S18 performed after the developing process S17. For example, the target profile TP may be used as reference data for controlling the output of the second heater that determines the temperature of the second heating plate.

Figure 15:
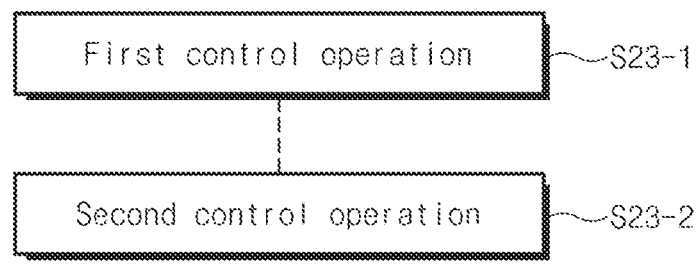
FIG. 15 is a detailed flowchart of a control operation of FIG. 12.
Figure 16:
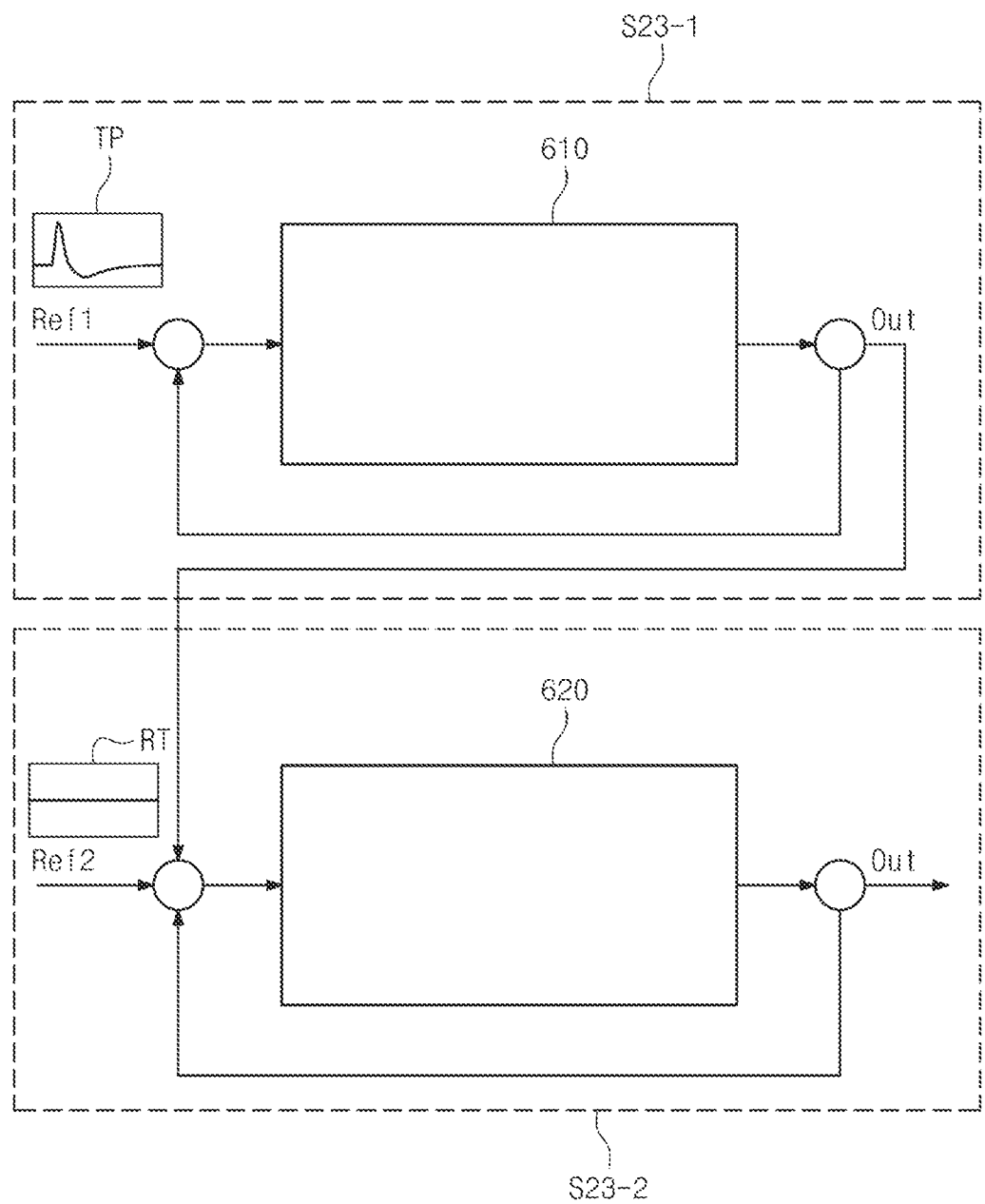
FIG. 16 is a block diagram schematically illustrating an example of a temperature control operation of a second heating plate to which a first control operation and a second control operation of FIG. 15 are applied.
Figure 17:
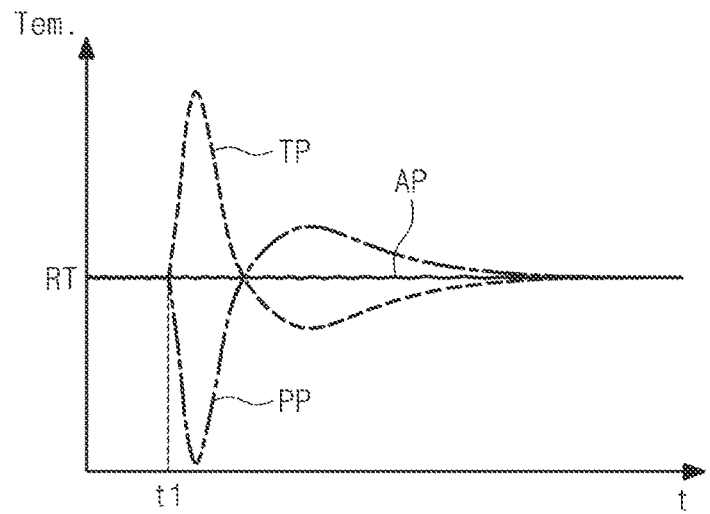
FIG. 17 is a graph schematically illustrating a temperature change of the second heating plate.

FIG. 15 is a detailed flowchart of the control operation of FIG. 12, FIG. 16 is a block diagram schematically illustrating an example of the temperature control operation of the second heating plate to which the first control operation and the second control operation of FIG. 15 are applied, and FIG. 17 is a graph schematically illustrating a temperature change of the second heating plate.

Referring to FIGS. 15 to 17, the control operation S23 according to the exemplary embodiment of the present invention may include a first control operation S23-1 and a second control operation step S23-2.

The first controller 610 may perform the first control operation S23-1. In the first control operation S23-1, the target profile TP may be used as reference data Ref1. In the first control operation S23-1, the temperature of the second heating plate may be controlled based on the target profile TP. The control value for controlling the temperature of the second heating plate in the first control operation S23-1 may be determined based on the target profile TP without being affected by the measurement value measured by the second temperature sensor.

The second controller 620 may perform the second control operation S23-2. In the second control operation S23, the set temperature RT may be used as reference data Ref2. In the second control operation S23-2, the temperature control of the second heating plate may be feedback-controlled based on the set temperature RT. For example, when the temperature of the second heating plate measured by the second temperature sensor is different from the set temperature RT, the second controller 620 controls the second heater to allow the temperature of the second heating plate to reach the set temperature RT. The process is repeated until the temperature of the second heating plate reaches the set temperature RT.

In addition, the time during which the first control operation S23-1 is performed and the time during which the second control operation S23-2 is performed may at least partially overlap. For example, the first control operation S23-1 and the second control operation S23-2 may be performed together. For example, the first control operation S23-1 may begin before the second control operation S23-2. Otherwise, the first control operation S23-1 may begin after the second control operation S23-2.

When the first control operation S23-1 and the second control operation S23-2 are performed together, the control value output of the first controller 610 and the control value output of the second controller 620 may be incorporated with each other to be transmitted to the second heater for controlling the temperature of the second heating plate.

Figure 3:
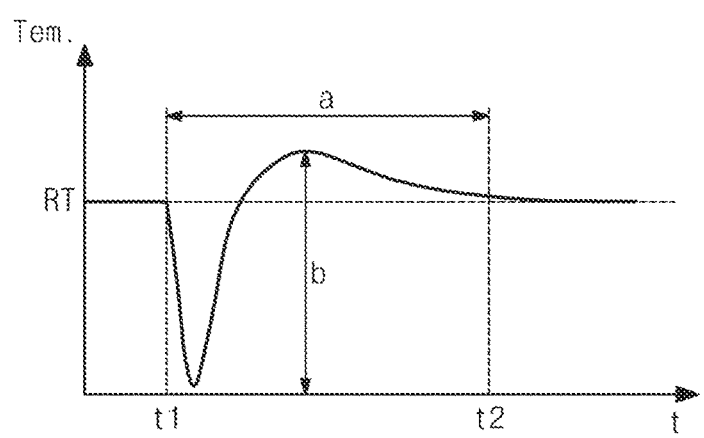
FIG. 3 is a graph illustrating an actual temperature change of the heating plate of FIG. 1.

The temperature change of the heating plate used in the heat treatment process of heating the substrate W is the same as that described with reference to FIG. 3. The temperature change of the heating plate illustrated in FIG. 3 is a result that appears because the controller C controlling the temperature of the heating plate uses only the set temperature RT with a constant temperature value as the reference data Ref and performs feedback control. More specifically, the controller C measures the temperature of the heating plate, and when the measured temperature is different from the set temperature RT, the process of adjusting the temperature of the heating plate is repeated. In other words, since the temperature of the heating plate is controlled after the temperature of the heating plate is preliminarily measured, it takes a lot of time to stabilize the temperature of the heating plate.

However, according to the exemplary embodiment of the present invention, the prediction profile PP is generated by predicting the temperature change of the second heating plate through the temperature data MP collected in the collection operation S21, and the target profile TP is generated through the generated prediction profile PP. And, in the control operation S23, the control value of the first controller 610 and the control value of the second controller 620 are incorporated to adjust the temperature of the second heating plate. With the control value output by the first controller 610, the actual temperature AT of the second heating plate may quickly approach the set temperature RT (preemptive response to a large temperature change). As the control value output by the second controller 620, a minute difference between the actual temperature AT and the set temperature RT of the second heating plate may be precisely controlled (removing the minute temperature difference). Accordingly, it is possible to effectively shorten the time during which the second heating process is performed, and to prevent a thermal shock from being excessively applied to the second heating plate by preventing a sudden temperature drop of the second heating plate.

In addition, after the exposure process S15, the second-1 heating process S16 performed at the first is a heating process affecting the greatest influence on the quality of a pattern formed on the substrate W. When the control operation S23 according to the exemplary embodiment of the present invention is performed in the second-1 heating process S16, it is possible to maintain the temperature of the second heating plate at the set temperature RT, so that it is possible to further improve the quality of the pattern formed on the substrate W.

In addition, as described above, since the generation of the target profile TP is performed while the exposure process S15 is performed, a problem in that the start of the second heating process is delayed may be prevented.

In addition, the degree of temperature change of the heating plate may vary according to the characteristics of the substrate W, such as size and type. However, according to the exemplary embodiment of the present invention, during the performance of the processes on one substrate W, the temperature of the second heating plate is controlled by predicting the temperature change of the second heating plate in the second heating process after the exposure through the temperature change of the first heating plate in the first heating process before exposure. In other words, since the target profile TP for temperature control of the second heating plate is generated for each substrate W, the unique characteristics of the individual substrate W may be more precisely reflected in the temperature control of the second heating plate.

Figure 18:
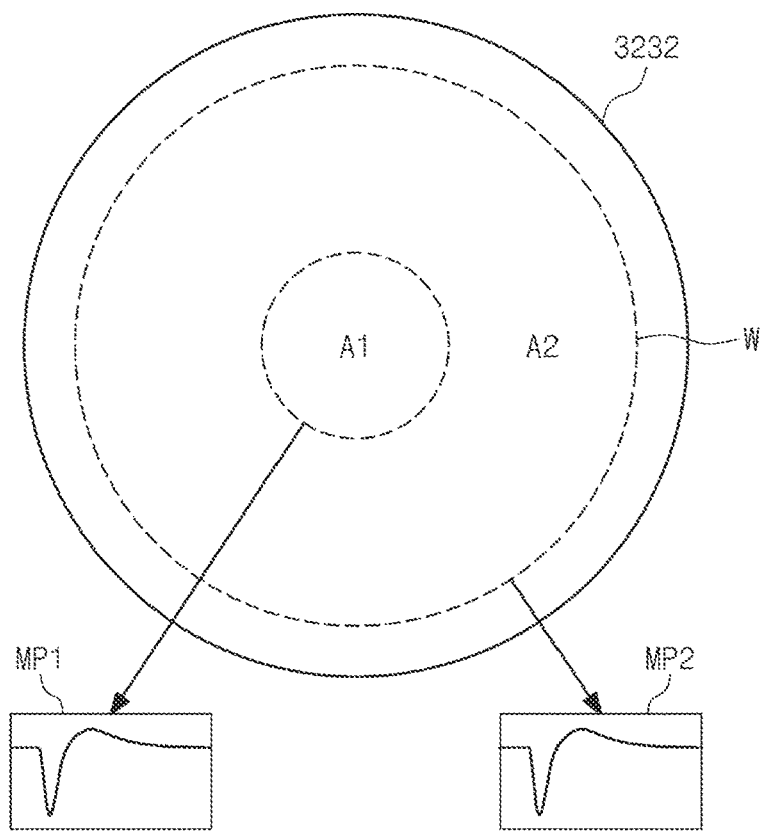
FIGS. 18 and 19 are diagrams for explaining a substrate treating method and a temperature control method according to another exemplary embodiment of the present invention.
Figure 19:
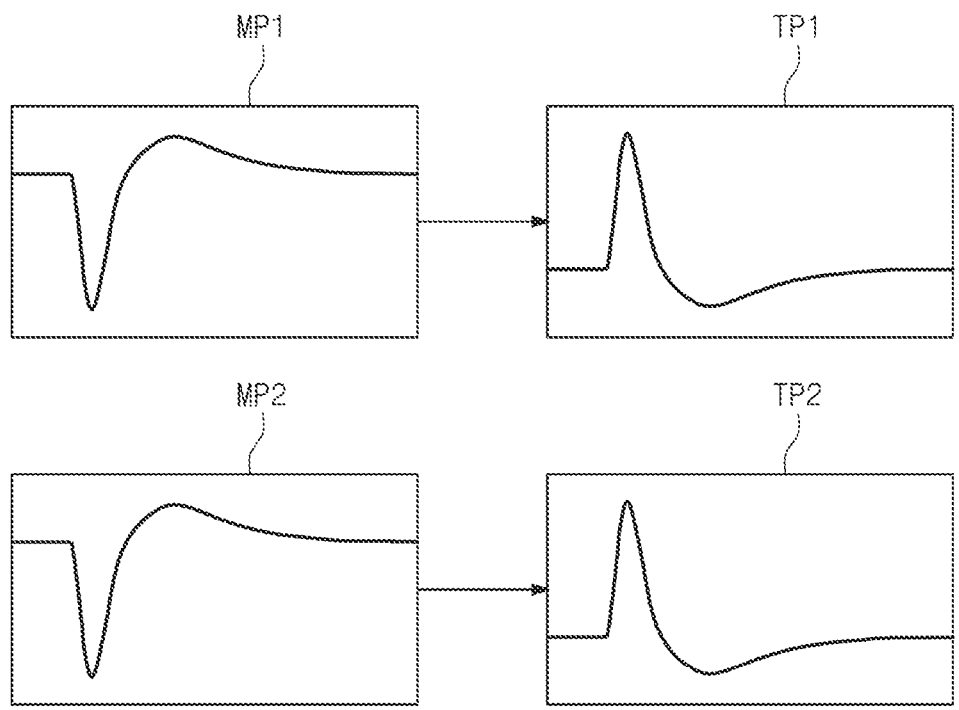

FIGS. 18 and 19 are diagrams for explaining a substrate treating method and a temperature control method according to another exemplary embodiment of the present invention.

The first heater of the first heat treating chamber, which is the heat treating chamber 320 provided in the above-described applying block 300a, may be provided in plurality so as to independently heat a first region A1 (the central region) and a second region A2 (edge region) of the substrate W when viewed from the top. For example, any one of the first heaters may be provided in the region of the first heating plate corresponding to the central region of the substrate W, and another one of the first heaters may be provided in the region of the first heating plate corresponding to the edge region of the substrate W.

Similarly, the second heater of the second heat treating chamber, which is the heat treating chamber 320 provided in the developing block 300*b*, may be provided in plurality so as to independently heat the first region A1 (the central region) and the second region A2 (edge region) of the substrate W when viewed from the top. For example, any one of the second heaters may be provided in the region of the second heating plate corresponding to the first region A1 that is the central region of the substrate W, and another one of the second heaters may be provided in the region of the second heating plate corresponding to the second region A2 that is the edge region of the substrate W.

In addition, the first temperature sensor may transmit first temperature data MP1 of the first heating plate corresponding to the first region A1 and second temperature data MP2 of the first heating plate corresponding to the second region A2 to the controller 600.

The controller 600 may generate a first target profile TP1 from the first temperature data MP1. Further, the controller 600 may generate a second target profile TP2 from the first temperature data MP1.

The controller 600 may control any one of the second heaters provided in the region of the second heating plate corresponding to the first region A1 that is the central region of the substrate W, and another one of the second heaters provided in the region of the second heating plate corresponding to the second region A2 that is the edge region of the substrate W based on the first target profile TP1.

In the above-described example, the present invention has been described based on the case where the first heating process is performed in the first heat treating chamber 320 that is the heat treating chamber 320 provided to the applying block 300*a*, and the second heating process is performed in the second heat treating chamber that is the heat treating chamber 320 provided to the developing block 300*b* as an example, but the present invention is not limited thereto. For example, the first heating process and the second heating process may be performed in the same heat treating chamber 320. In this case, it means that the first heating plate and the second heating plate include the same configuration.

Figure 20:
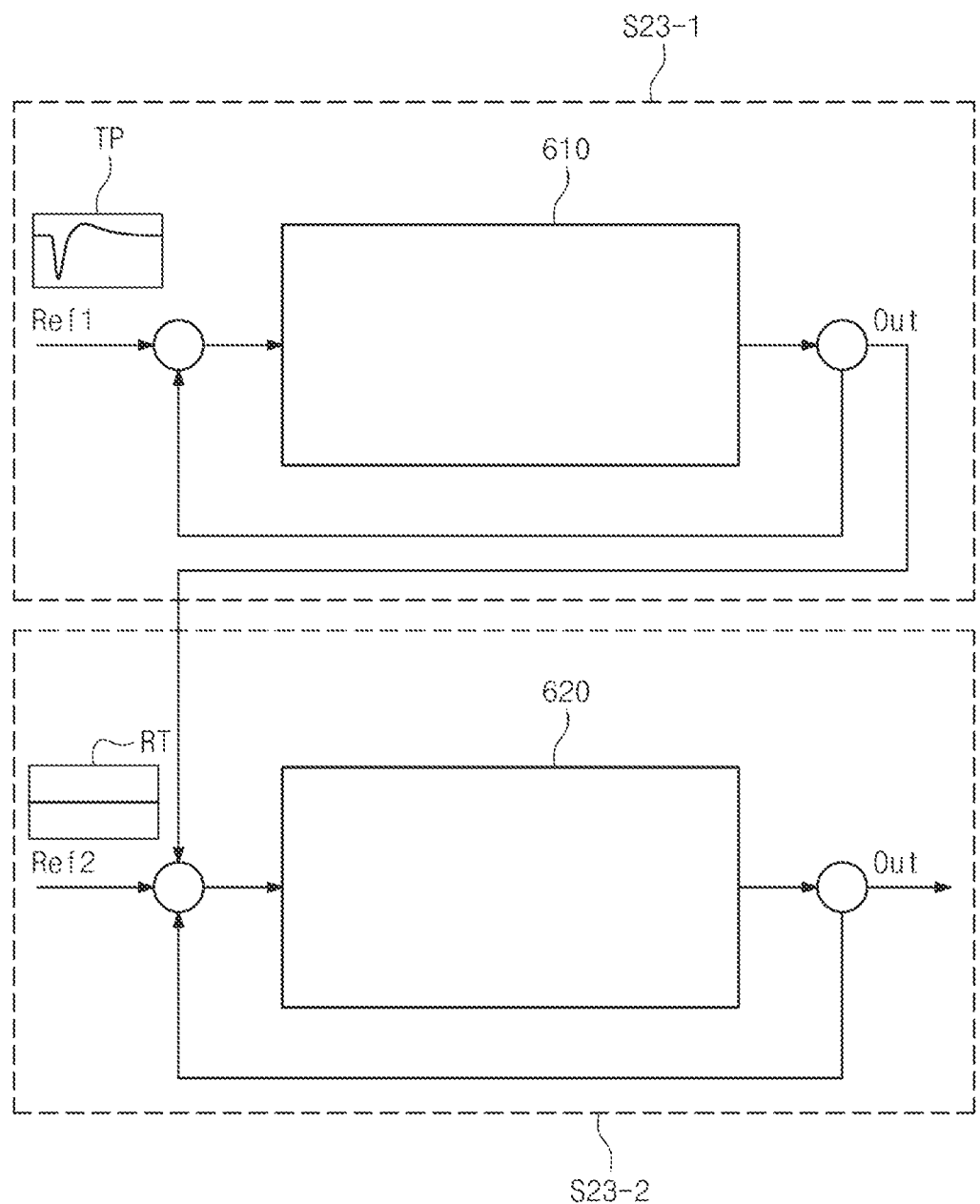
FIG. 20 is a block diagram schematically illustrating another example of a temperature control operation of a cooling plate to which the first control operation and the second control operation of FIG. 15 are applied.
Figure 21:
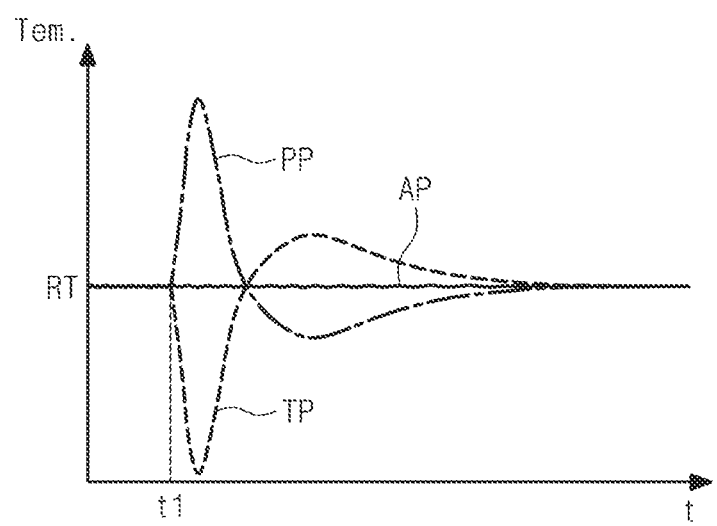
FIG. 21 is a graph schematically illustrating a temperature change of the cooling plate.

In the above-described example, the present invention has been described based on the case where the temperature control method of the plate adjusting the temperature of the substrate W is applied to the hating plate, but the present invention is not limited thereto. For example, the temperature control method of the plate for controlling the temperature of the substrate W may be applied to the temperature control of the cooling plate 3222 in the same or similar manner. For example, as illustrated in FIGS. 20 and 21, the cooling plate 322 cooling the substrate W before the exposure process is referred to as a first cooling plate and the cooling plate 322 cooling the substrate W after the exposure process is referred to as a second cooling plate, and the temperature control method may perform a first control operation S23-1 of generating a prediction profile PP by predicting a temperature change of the second cooling plate by collecting temperature data of the first cooling plate used in the first cooling process performed before the exposure process, generating a target profile TP from the generated prediction profile PP, and adjusting a temperature of the second cooling plate based on the generated target profile TP, and a second control operation S23-2 of measuring a temperature of the second cooling plate and feedback-controlling the temperature of the second cooling plate based on the measured temperature.

Also, in the above-described example, the present invention has been described based on the case where the control value output of the first controller 610 and the control value output of the second controller 620 are incorporated when the first control operation S23-1 and the second control operation S23-2 are performed together and transmitted to the second heater for controlling the temperature of the second heating plate as an example, but the present invention is not limited thereto. For example, the control value output of the first controller 610 and the control value output of the second controller 620 may be performed alternately. For example, the first controller 610 may output the control value 0.1 after second after the start of the process, the second controller 620 may output the control value after 0.2 seconds after the start of the process, the first control controller 610 may output the control value again after 0.3 seconds, and the second controller 620 may output the control value after 0.4 seconds after the start of the process. Since the reference data Ref1 outputs the control value by the target profile TP independent of the measurement value of the second temperature sensor, the first controller 610 may output the control value capable of responding to a large temperature change of the second heating plate. Since the control value output by the second controller 620 is determined based on the temperature of the second heating plate measured by the second temperature sensor, the second controller 620 may output the control value corresponding to a minute temperature change of the second heating plate.

In addition, the accuracy of the aforementioned prediction profile PP may be supplemented based on actual process results. For example, after the substrate W is transferred to the second heating plate, when there is a difference by comparing the temperature of the second heating plate measured by the second temperature sensor and the predicted prediction profile PP, the prediction profile PP may be corrected, and the target profile TP may be regenerated based on the corrected prediction profile PP.

The foregoing detailed description illustrates the present invention. In addition, the above description shows and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A method of treating a substrate, the method comprising:
    performing a first heating process of heat-treating the substrate formed with a film, and a second heating process of heat-treating the substrate after the first heating process is performed;
    a collection operation of collecting temperature data of a first heating plate which heats the substrate in the first heating process; and a first control operation of adjusting a temperature of a second heating plate which heats the substrate in the second heating process based on the temperature data, wherein the temperature data includes information about a temperature change of a first temperature adjusting plate while a first temperature adjusting process is performed, wherein a prediction profile is generated by a transform function which receives the temperature data and outputs the prediction profile, and wherein the transform function is generated based on pre-obtained reference data including the information about the temperature change of the first temperature adjusting plate according to a set treatment condition when the substrate is heated by using the first temperature adjusting plate, and information about a temperature change of a second temperature adjusting plate according to a set treatment condition when the substrate is heated by using the second temperature adjusting plate.

2. The method of claim 1, further comprising:

a generating operation of generating a target profile for controlling a temperature of the second heating plate from the temperature data, wherein the first control operation includes adjusting the temperature of the second heating plate based on the target profile.

3. The method of claim 2, further comprising:

a second control operation of measuring the temperature of the second heating plate in the second heating process and feedback-controlling the temperature of the second heating plate based on the measured temperature.

4. The method of claim 2, further comprising:

an exposure process of irradiating the film with light, wherein the second heating process is performed after the exposure process.

5. The method of claim 4, further comprising:

a developing process of supplying a developer to the film irradiated with the light, wherein the second heating process is performed before the developing process.

6. The method of claim 4, wherein the second heating process is performed multiple times, and a developing process of supplying a developer to the film irradiated with the light is further included, any one of the second heating processes is performed before the developing process, and another one of the second heating processes is performed after the developing process.

7. The method of claim 4, wherein the first heating process is performed before the exposure process.

8. The method of claim 7, wherein the first heating process is performed multiple times, the collection operation includes collecting two or more temperature data from the first heating processes, and the generating operation includes generating the target profile from the temperature data.

9. A method of controlling a temperature of a temperature adjusting plate that adjusts a temperature of a substrate, the method comprising:

performing a temperature adjusting process that adjusts the temperature of the substrate formed with a film multiple times;

a collection operation of collecting temperature data of a first temperature adjusting plate used in a first temperature adjusting process performed before an exposure process among the temperature adjusting processes;

a generating operation of predicting a temperature change of a second temperature adjusting plate used in a second temperature adjusting process performed after the exposure process among the temperature adjusting processes based on the temperature data and generating a prediction profile; and a first control operation of controlling a temperature of the second temperature adjusting plate based on the prediction profile, wherein the temperature data includes information about a temperature change of the first temperature adjusting plate while the first temperature adjusting process is performed, wherein the prediction profile is generated by a transform function which receives the temperature data and outputs the prediction profile, and wherein the transform function is generated based on pre-obtained reference data including the information about the temperature change of the first temperature adjusting plate according to a set treatment condition when the substrate is heated by using the first temperature adjusting plate, and information about a temperature change of the second temperature adjusting plate according to a set treatment condition when the substrate is heated by using the second temperature adjusting plate.

10. The method of claim 9, wherein the generating operation includes generating a target profile symmetric to the prediction profile based on a set temperature, and in the first control operation, a control value for controlling the temperature of the second temperature adjusting plate is determined based on the target profile.

11. The method of claim 10, further comprising:

a second control operation of measuring a temperature of the second temperature adjusting plate in the second temperature adjusting process, and feedback-controlling the temperature of the second temperature adjusting plate to be the set temperature based on the measured temperature, wherein the control value for controlling the temperature of the second temperature adjusting plate in the second control operation is determined based on the measured temperature of the second temperature adjusting plate.

12. The method of claim 11, wherein a time during which the first control operation is performed and a time during which the second control operation is performed at least partially overlap.

13. The method of claim 10, wherein the first temperature adjusting process is performed multiple times, the collection operation includes collecting the temperature data from the first temperature adjusting processes, and the generating operation includes generating the target profile from the temperature data.

* * * * *